(12) United States Patent
Mimura

(10) Patent No.: US 11,394,367 B2
(45) Date of Patent: *Jul. 19, 2022

(54) ACOUSTIC WAVE DEVICE, HIGH FREQUENCY FRONT END CIRCUIT, AND COMMUNICATION APPARATUS

(71) Applicant: Murata Manufacturing Co., Ltd., Nagaokakyo (JP)

(72) Inventor: Masakazu Mimura, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/088,635

(22) Filed: Nov. 4, 2020

(65) Prior Publication Data

US 2021/0050841 A1 Feb. 18, 2021

Related U.S. Application Data

(63) Continuation of application No. 16/589,195, filed on Oct. 1, 2019, now Pat. No. 10,862,451, which is a (Continued)

(30) Foreign Application Priority Data

Apr. 17, 2017 (JP) ................................ JP2017-081432

(51) Int. Cl.
*H04B 1/24* (2006.01)
*H04B 1/28* (2006.01)
(Continued)

(52) U.S. Cl.
CPC ............. *H03H 9/145* (2013.01); *H03F 3/189* (2013.01); *H03F 3/21* (2013.01); *H03H 7/0161* (2013.01); *H03H 9/54* (2013.01); *H03H 9/76* (2013.01)

(58) Field of Classification Search
CPC ........ H03H 9/145; H03H 7/0161; H03H 9/54; H03H 9/76; H03H 9/725; H03H 9/02559;
(Continued)

(56) References Cited

U.S. PATENT DOCUMENTS 10,862,451 B2 * 12/2020 Mimura ............ H03H 9/02559
11,264,969 B1 *  3/2022 Fenzi ..................... H03H 9/13
2021/0399711 A1 * 12/2021 Ajima ..................... H03H 3/08

OTHER PUBLICATIONS

Mimura, "Acoustic Wave Device, High Frequency Front End Circuit, and Communication Apparatus", U.S. Appl. No. 16/589,195, filed Oct. 1, 2019.

* cited by examiner

*Primary Examiner* — Andrew Wendell
(74) *Attorney, Agent, or Firm* — Keating & Bennett, LLP

(57) ABSTRACT

An acoustic wave device includes a piezoelectric substrate made of $LiNbO_3$, and a dielectric film provided on the piezoelectric substrate to cover first and second IDT electrodes on the piezoelectric substrate. The first and second IDT electrodes include main electrode layers. When wave lengths determined by electrode finger pitches of the first and second IDT electrodes are $\lambda_1$ and $\lambda_2$, respectively, the average value thereof is $\lambda_0$, $\lambda_1/\lambda_0 = 1+X$, and $\lambda_2/\lambda_0 = 1-X$, a relationship of $0.05 \leq X \leq 0.65$ is satisfied. The wavelength $\lambda_1$ is the longest, and the wavelength $\lambda_2$ is the shortest. In Euler angles ($\varphi$, $\theta$, $\psi$) of the piezoelectric substrate, $\varphi$ is $0°\pm5°$, $\psi$ is $0°\pm10°$, and $\theta$ satisfies Expression 1, wherein a relationship of $B_1 < T \times r \leq 0.10\lambda_0$ and $B_2 < T \times r \leq 0.10\lambda_0$ are satisfied.

12 Claims, 16 Drawing Sheets

Related U.S. Application Data continuation of application No. PCT/JP2018/014221, filed on Apr. 3, 2018.

(51) Int. Cl.
*H03H 9/145* (2006.01)
*H03F 3/189* (2006.01)
*H03F 3/21* (2006.01)
*H03H 7/01* (2006.01)
*H03H 9/54* (2006.01)
*H03H 9/76* (2006.01)

(58) Field of Classification Search
CPC ........ H03H 9/14541; H03H 9/25; H03H 9/64;
H03H 9/72; H03F 3/189; H03F 3/21;
H04B 1/24; H04B 1/28; H04B 1/40;
H04B 1/0017; H04B 1/0067
See application file for complete search history.

ACOUSTIC WAVE DEVICE, HIGH FREQUENCY FRONT END CIRCUIT, AND COMMUNICATION APPARATUS

CROSS REFERENCE TO RELATED APPLICATIONS

This application claims the benefit of priority to Japanese Patent Application No. 2017-081432 filed on Apr. 17, 2017 and is a Continuation Application of PCT Application No. PCT/JP2018/014221 filed on Apr. 3, 2018. The entire contents of each application are hereby incorporated herein by reference.

BACKGROUND OF THE INVENTION

1. Field of the Invention

The present invention relates to an acoustic wave device using a Rayleigh wave, a high frequency front end circuit, and a communication apparatus.

2. Description of the Related Art

In recent years, there has been a growing need for increasing the speed of data communication in mobile information terminals, and therefore a technique to simultaneously perform communication in a large number of bands by carrier aggregation or the like, a technique to widen a bandwidth also in an individual band, and the like are needed. At the same time, since mobile information terminals are always required to be miniaturized, acoustic wave devices used in the mobile information terminals are also required to be even more miniaturized.

In order to meet the requirement for miniaturization, there is a demand for a technique to provide a plurality of band pass filters having different pass bands on the same piezoelectric substrate. For this purpose, it is necessary to form a plurality of interdigital transducer (IDT) electrodes having largely different electrode finger pitches on the same piezoelectric substrate. Also in a case where a single filter is formed on the same piezoelectric substrate, there is a demand for a technique to form a plurality of IDT electrodes having largely different electrode finger pitches on the same piezoelectric substrate in order to widen the bandwidth.

In International Publication No. WO 2017/006742, an example of an acoustic wave device is described. The acoustic wave device utilizes a Rayleigh wave propagating through a piezoelectric substrate made of $LiNbO_3$. A dielectric layer is provided on the piezoelectric substrate to cover an IDT electrode.

SUMMARY OF THE INVENTION

Preferred embodiments of the present invention provide acoustic wave devices, high frequency front end circuits, and communication apparatuses each able to effectively reduce or prevent unwanted waves even when a plurality of IDT electrodes with different electrode finger pitches is provided on the same piezoelectric substrate.

An acoustic wave device according to a preferred embodiment of the present invention includes a piezoelectric substrate made of $LiNbO_3$, a plurality of IDT electrodes provided on the piezoelectric substrate and including a first IDT electrode and a second IDT electrode, and a dielectric film provided on the piezoelectric substrate to cover the plurality of IDT electrodes. Further, the first IDT electrode and the second IDT electrode include main electrode layers. When a wave length determined by an electrode finger pitch of the first IDT electrode is $\lambda_1$, a wave length determined by an electrode finger pitch of the second IDT electrode is $\lambda_2$, an average value $\lambda_0$ of the wave length $\lambda_1$ and the wave length $\lambda_2$ is defined by an equation of $\lambda_0=(\lambda_1+\lambda_2)/2$, $\lambda_1/\lambda_0=1+X$, and $\lambda_2/\lambda_0=1-X$, a relationship of $0.05 \le X \le 0.65$ is satisfied. Among the plurality of IDT electrodes, the wave length $\lambda_1$ of the first IDT electrode is the longest and the wave length $\lambda_2$ of the second IDT electrode is the shortest. When a film thickness obtained by normalizing, with the average value $\lambda_0$, at least one of film thicknesses of the main electrode layer of the first IDT electrode and the main electrode layer of the second IDT electrode is T, and a density ratio of a material of the main electrode layer to Pt is r, in Euler angles $(\varphi, \theta, \psi)$ of the piezoelectric substrate, $\varphi$ is $0° \pm 5°$, $\psi$ is $0° \pm 10°$, and $\theta$ satisfies Expression 1.

$$-A_1/(T \times r - B_1) + C_1 \le \theta \le -A_2/(T \times r - B_2) + C_2 \quad \text{Expression 1}$$

A relationship of $B_1 < T \times r \le 0.10\lambda_0$ and a relationship of $B_2 < T \times r \le 0.10\lambda_0$ are satisfied, and $A_1, B_1, C_1, A_2, B_2$ and $C_2$ in the Expression 1 are represented by Expression 2 through Expression 8 below using X.

$$A_1 = 0.056 \times 10^{-4.93 \times X} + 0.0016 \quad \text{Expression 2}$$

$$B_1 = -0.088 \times X^2 + 0.066 \times X + 0.0386 \, (0.05 \le X \le 0.375) \quad \text{Expression 3}$$

$$B_1 = 0.051 \, (0.375 \le X \le 0.65) \quad \text{Expression 4}$$

$$C_1 = 0.714 \times 10^{-5.26 \times X} + 29.37 \quad \text{Expression 5}$$

$$A_2 = 0.0987 \times X^2 - 0.0918 \times X + 0.0644 \quad \text{Expression 6}$$

$$B_2 = -0.0651 \times X^2 + 0.1114 \times X + 0.0351 \quad \text{Expression 7}$$

$$C_2 = 0.7830 \times X^2 - 1.7424 \times X + 32.70 \quad \text{Expression 8}$$

An acoustic wave device according to a preferred embodiment of the present invention includes a piezoelectric substrate made of $LiNbO_3$, a plurality of IDT electrodes provided on the piezoelectric substrate and including a first IDT electrode and a second IDT electrode, and a dielectric film provided on the piezoelectric substrate to cover the plurality of IDT electrodes. Further, the first IDT electrode and the second IDT electrode include main electrode layers. When a wave length determined by an electrode finger pitch of the first IDT electrode is $\lambda_1$, a wave length determined by an electrode finger pitch of the second IDT electrode is $\lambda_2$, an average value $\lambda_0$ of the wave length $\lambda_1$ and the wave length $\lambda_2$ is defined by an equation of $\lambda_0=(\lambda_1+\lambda_2)/2$, $\lambda_1/\lambda_0=1+X$, and $\lambda_2/\lambda_0=1-X$, a relationship of $0.05 \le X \le 0.65$ is satisfied. Among the plurality of IDT electrodes, the wave length $\lambda_1$ of the first IDT electrode is the longest and the wave length $\lambda_2$ of the second IDT electrode is the shortest. When a film thickness obtained by normalizing, with the average value $\lambda_0$, at least one of film thicknesses of the main electrode layer of the first IDT electrode and the main electrode layer of the second IDT electrode is T, and a density ratio of a material of the main electrode layer to Pt is r, in Euler angles $(\varphi, \theta, \psi)$ of the piezoelectric substrate, $\varphi$ is $0° \pm 5°$, $\psi$ is $0° \pm 10°$, and $\theta$ satisfies Expression 1.

$$-A_1/(T \times r - B_1) + C_1 \le \theta \le -A_2/(T \times r - B_2) + C_2 \quad \text{Expression 1}$$

A relationship of $B_1 < T \times r \le 0.12\lambda_0$ and a relationship of $B_2 < T \times r \le 0.12\lambda_0$ are satisfied, and $A_1, B_1, C_1, A_2, B_2$ and $C_2$ in the Expression 1 are represented by Expression 2 through Expression 8 using X.

$$A_1 = 0.056 \le X \le 10^{-4.93 \times X} + 0.0016 \quad \text{Expression 2}$$

$$B_1=-0.088 \times X^2+0.066 \times X+0.0386 (0.05 \leq X \leq 0.375) \quad \text{Expression 3}$$

$$B_1=0.051 (0.375 \leq X \leq 0.65) \quad \text{Expression 4}$$

$$C_1=0.714 \times 10^{-5.26 \times X}+29.37 \quad \text{Expression 5}$$

$$A_2=0.0987 \times X^2-0.0918 \times X+0.0644 \quad \text{Expression 6}$$

$$B_2=-0.0651 \times X^2+0.1114 \times X+0.0351 \quad \text{Expression 7}$$

$$C_2=0.7830 \times X^2-1.7424 \times X+32.70 \quad \text{Expression 8}$$

In an acoustic wave device according to a preferred embodiment of the present invention, a film thickness and a material of the main electrode layer of the first IDT electrode are the same or substantially the same as a film thickness and a material of the main electrode layer of the second IDT electrode, and a film thickness of a portion of the dielectric layer provided on the first IDT electrode is equal or substantially equal to a film thickness of a portion of the dielectric film provided on the second IDT electrode.

In an acoustic wave device according to a preferred embodiment of the present invention, the dielectric film includes silicon oxide as a main ingredient. In this case, it is possible to improve frequency-temperature characteristics.

In an acoustic wave device according to a preferred embodiment of the present invention, a plurality of band pass filters belonging to communication bands of different pass bands are provided on the piezoelectric substrate.

In an acoustic wave device according to a preferred embodiment of the present invention, an antenna terminal to be connected to an antenna is provided on the piezoelectric substrate, and the plurality of band pass filters are connected commonly to the antenna terminal to define a composite filter.

In an acoustic wave device according to a preferred embodiment of the present invention, a composite filter is not defined by the plurality of band pass filters.

A high frequency front end circuit according to a preferred embodiment of the present invention includes an acoustic wave device according to a preferred embodiment of the present invention, and a power amplifier.

A communication apparatus according to a preferred embodiment of the present invention includes a high frequency front end circuit according to a preferred embodiment of the present invention, and an RF signal processing circuit.

With the acoustic wave devices, the high frequency front end circuits, and the communication apparatuses according to preferred embodiments of the present invention, it is possible to effectively reduce or prevent unwanted waves even when a plurality of IDT electrodes having different electrode finger pitches is provided on the same piezoelectric substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to the accompanying drawings.

The preferred embodiments described herein are illustrative and a partial substitution or combination of configurations may be possible between different preferred embodiments.

Figure 1:
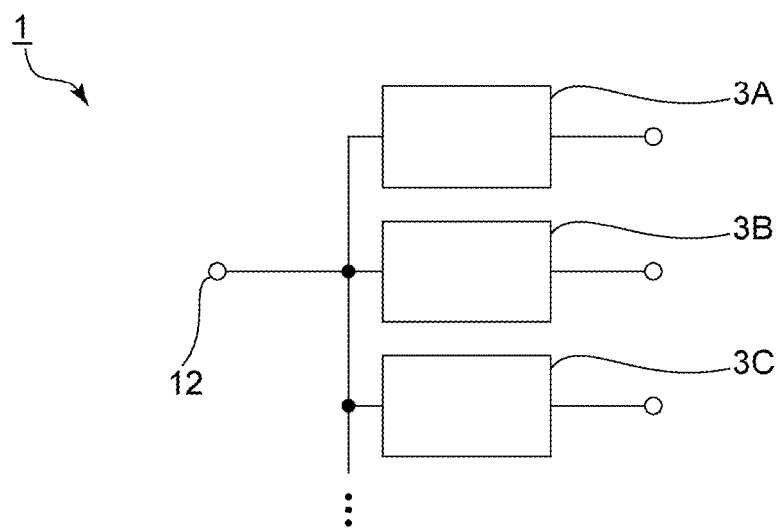
FIG. 1 is a schematic view of an acoustic wave device according to a first preferred embodiment of the present invention.

FIG. 1 is a schematic view of an acoustic wave device according to a first preferred embodiment of the present invention.

An acoustic wave device 1 includes an antenna terminal 12 to be connected to an antenna, and a plurality of band pass filters connected commonly to the antenna terminal 12. The pass bands of the plurality of band pass filters are different from each other. The acoustic wave device 1 of the present preferred embodiment is a composite filter device used for carrier aggregation or the like.

The plurality of band pass filters includes a first band pass filter 3A, a second band pass filter 3B, and a third band pass filter 3C. The acoustic wave device 1 also may include a band pass filter other than the first band pass filter 3A, the second band pass filter 3B, and the third band pass filter 3C. The number of band pass filters is not particularly limited.

Among the plurality of band pass filters, the pass band of the first band pass filter 3A is located on the lowest frequency side. On the other hand, among the plurality of band pass filters, the pass band of the second band pass filter 3B is located on the highest frequency side.

Here, the acoustic wave device 1 includes a piezoelectric substrate. The first band pass filter 3A and the second band pass filter 3B are provided on the same piezoelectric substrate.

The first band pass filter 3A includes a plurality of acoustic wave resonators including a first acoustic wave resonator. Similarly, the second band pass filter 3B includes a plurality of acoustic wave resonators including a second acoustic wave resonator. The first band pass filter 3A, the second band pass filter 3B, and the third band pass filter 3C may preferably be ladder filters, for example, or may include a longitudinally coupled resonator acoustic wave filter. It is sufficient that the first band pass filter 3A includes at least the first acoustic wave resonator. It is sufficient that the second band pass filter 3B includes at least the second acoustic wave resonator. The circuit configurations of the first band pass filter 3A, the second band pass filter 3B, and the third band pass filter 3C are not particularly limited.

Figure 2:
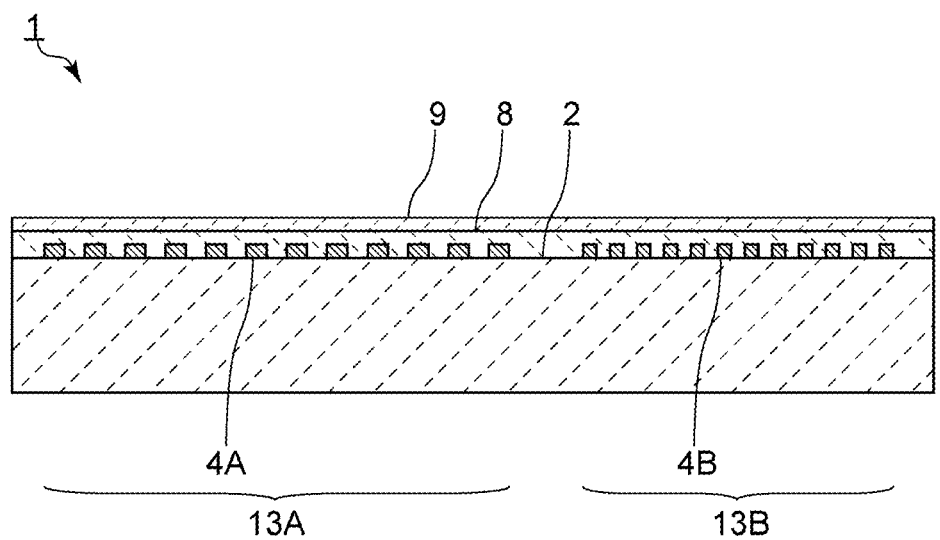
FIG. 2 is a schematic elevational cross-sectional view of the acoustic wave device according to the first preferred embodiment of the present invention.

FIG. 2 is a schematic elevational cross-sectional view of the acoustic wave device according to the first preferred embodiment.

A piezoelectric substrate 2 illustrated in FIG. 2 is preferably made of $LiNbO_3$, for example. In the present preferred embodiment, preferably, in Euler angles (φ, θ, ψ) of the piezoelectric substrate 2, φ is 0°±5° and ψ is 0°±10°, for example. Note that, θ in the Euler angles (0°±5°, 0, 0°±10°) will be described later. In this specification, for example, 0°±5° indicates a range from −5° to 5°.

On the piezoelectric substrate 2, the first acoustic wave resonator 13A and the second acoustic wave resonator 13B are provided. In FIG. 2, although the first acoustic wave resonator 13A and the second acoustic wave resonator 13B are disposed at positions adjacent to each other, the arrangement of the first acoustic wave resonator 13A and the second acoustic wave resonator 13B is not particularly limited.

Figure 3:
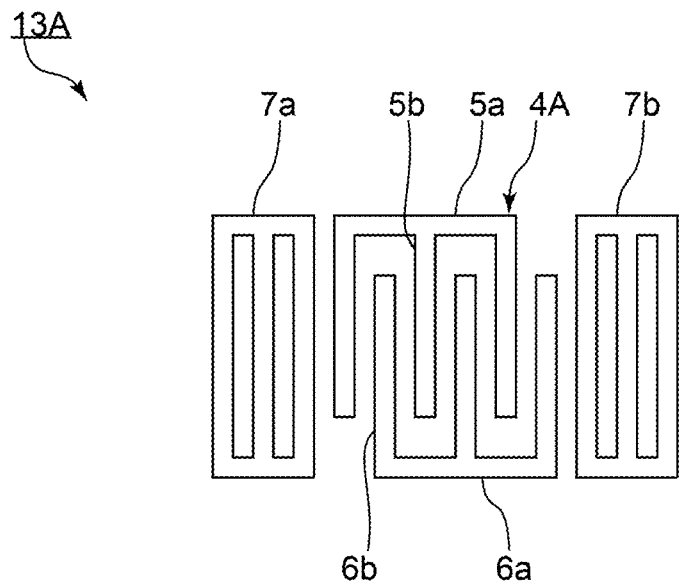
FIG. 3 is a schematic plan view illustrating an electrode structure of a first acoustic wave resonator in the first preferred embodiment of the present invention.

FIG. 3 is a schematic plan view illustrating an electrode structure of the first acoustic wave resonator in the first preferred embodiment.

The first acoustic wave resonator 13A includes a first IDT electrode 4A provided on the piezoelectric substrate. When an AC voltage is applied to the first IDT electrode 4A, an acoustic wave is excited. The acoustic wave device 1 uses a Rayleigh wave as an acoustic wave. Reflectors 7a and 7b are disposed on both sides of the first IDT electrode 4A in an acoustic wave propagation direction.

The first IDT electrode 4A includes a first busbar 5a and a second busbar 6a opposing each other. The first IDT electrode 4A includes a plurality of first electrode fingers 5b whose one ends are connected to the first busbar 5a. Further, the first IDT electrode 4A includes a plurality of second electrode fingers 6b whose one ends are connected to the second busbar 6a. The plurality of first electrode fingers 5b and the plurality of second electrode fingers 6b are interleaved with each other.

Figure 4:
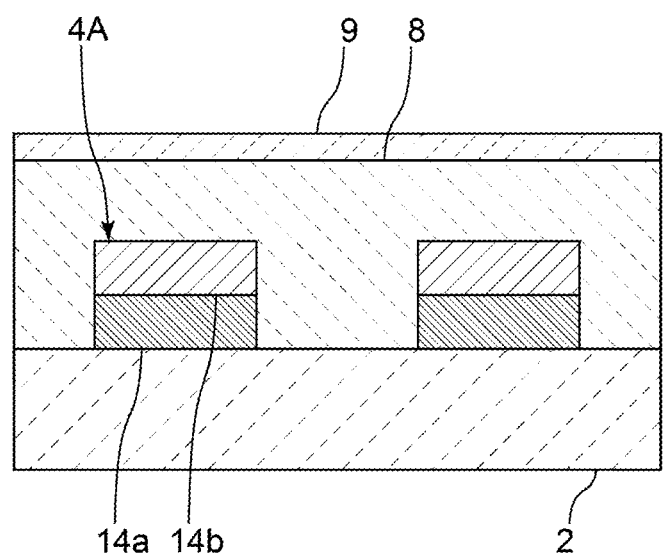
FIG. 4 is an enlarged elevational cross-sectional view of a first IDT electrode in the first preferred embodiment of the present invention.

FIG. 4 is an enlarged elevational cross-sectional view of the first IDT electrode in the first preferred embodiment.

The first IDT electrode 4A includes a main electrode layer 14a provided on the piezoelectric substrate 2, and a conductive auxiliary electrode layer 14b provided on the main electrode layer 14a. In the present specification, the main electrode layer is a metal layer that occupies the largest mass among the metal layers constituting the IDT electrode.

Although the material used for the first IDT electrode 4A is not particularly limited, the main electrode layer 14a is preferably made of, for example, Pt in the present preferred embodiment. In addition to Pt, a metal having a relatively high density, such as Au, W, Mo or Cu, may preferably be used for the main electrode layer 14a. The conductive auxiliary electrode layer 14b is preferably made of, for example, Al. By including the conductive auxiliary electrode layer 14b having relatively low electric resistance, the electric resistance of the first IDT electrode 4A is able to be lowered. The reflectors of the first acoustic wave resonator are preferably made of metal layers that are the same as or similar to those of the first IDT electrode 4A.

In the present preferred embodiment, the first IDT electrode 4A includes the main electrode layer 14a and the conductive auxiliary electrode layer 14b, and it may include a close contact layer. The close contact layer can be disposed, for example, between the piezoelectric substrate 2 and the main electrode layer 14a, or on the conductive auxiliary electrode layer 14b. For the close contact layer, NiCr, Ti, or Cr may preferably be used, for example. A diffusion preventing layer may be provided between the main electrode layer 14a and the conductive auxiliary electrode layer 14b. For example, Ti may preferably be used for the diffusion preventing layer. Note that the first IDT electrode 4A may include only the main electrode layer 14a.

Similarly to the first acoustic wave resonator, the second acoustic wave resonator also includes a second IDT electrode 4B illustrated in FIG. 2, and reflectors. Other acoustic wave resonators of the first band pass filter and the second band pass filter also include, respectively, IDT electrodes and resonators. In the present preferred embodiment, the film thicknesses and materials of the first IDT electrode 4A and reflectors, the second IDT electrode 4B and reflectors, and other IDT electrodes and reflectors of the first band pass filter and the second band pass filter are preferably substantially the same. In this specification, "substantially the same" means that the film thicknesses and materials are the same to the extent that the deterioration in electric characteristics of the acoustic wave device 1 does not occur. For example, in practice, even when IDT electrodes, reflectors, and the like are provided as to have the same film thickness, a manufacture variation in film thickness is generated. However, in the case where the difference in film thickness is such that the deterioration in the electric characteristics is not caused, the film thicknesses may be considered to be substantially the same.

Here, a wave length determined by an electrode finger pitch of the first IDT electrode 4A is defined as $\lambda_1$, and a wave length determined by an electrode finger pitch of the second IDT electrode 4B is defined as $\lambda_2$. At this time, among the wave lengths of the plurality of IDT electrodes, the wave length $\lambda_1$ of the first IDT electrode is the longest, and the wave length $\lambda_2$ of the second IDT electrode is the shortest. In the present preferred embodiment, when an average value $\lambda_0$ of the wave lengths $\lambda_1$ and $\lambda_2$ is obtained by an equation of $\lambda_0=(\lambda_1+\lambda_2)/2$, $\lambda_1/\lambda_0=1+X$, and $\lambda_2/\lambda_0=1-X$, a relationship of $0.05 \le X \le 0.65$ is satisfied.

As illustrated in FIG. 2, a first dielectric film 8 is provided on the piezoelectric substrate 2. The first dielectric film 8 covers the first IDT electrode 4A, the second IDT electrode 4B, and the reflectors. The thickness of a portion of the first dielectric film 8 provided on the first IDT electrode 4A and the thickness of a portion thereof provided on the second IDT electrode 4B are equal or substantially equal.

In the present preferred embodiment, the first dielectric film 8 preferably includes, as a main ingredient, silicon oxide such as $SiO_2$, for example. This makes it possible to lower the absolute value of a temperature coefficient of frequency and improve the frequency-temperature characteristics. In addition, the surfaces of the plurality of IDT electrodes are protected, and the plurality of IDT electrodes are unlikely to be damaged. In this specification, the term "main ingredient" refers to an ingredient occupying equal to or greater than about 50% by weight. The material of the first dielectric film 8 is not limited to the above, and may be, for example, silicon oxynitride, tellurium oxide, or the like.

A second dielectric film 9 is provided on the first dielectric film 8. In the present preferred embodiment, the second dielectric film 9 is preferably made of, for example, silicon nitride such as SiN. By adjusting the film thickness of the second dielectric film 9, frequency adjustment can be easily performed. The material of the second dielectric film 9 is not limited to the above, and may be, for example, aluminum oxide, aluminum nitride, or silicon oxynitride.

The present preferred embodiment includes the piezoelectric substrate 2 made of $LiNbO_3$, the plurality of IDT electrodes provided on the piezoelectric substrate 2 and including the first IDT electrode 4A and the second IDT electrode 4B, and the first dielectric film 8 provided on the piezoelectric substrate 2 to cover the plurality of IDT electrodes, and further has a structure as follows. (1) In the first IDT electrode 4A and the second IDT electrode 4B, $\lambda_1/\lambda_0=1+X$, $\lambda_2/\lambda_0=1-X$, and a relationship of $0.05 \le X \le 0.65$ is satisfied. (2) When the film thickness obtained by normalizing, with the average value $\lambda_0$, at least one of the film thicknesses of the main electrode layer of the first IDT electrode 4A and the main electrode layer of the second IDT electrode 4B is T, and the density ratio of the material of the main electrode layer to Pt is r, $\theta$ in the Euler angles (0°±5°, $\theta$, 0°±10°) of the piezoelectric substrate 2 satisfies Expression 1 through Expression 8 given below. Note that the density ratio r is a value obtained by dividing the density of the material of the main electrode layer by the density of Pt.

$$-A_1/(T \times r - B_1) + C_1 \le \theta \le -A_2/(T \times r - B_2) + C_2 \quad \text{Expression 1}$$

A relationship of $B_1 < T \times r \le 0.10\lambda_0$ and a relationship of $B_2 < T \times r \le 0.10\lambda_0$ are satisfied. $A_1$, $B_1$, $C_1$, $A_2$, $B_2$, and $C_2$ in the above Expression 1 are represented by Expression 2 through Expression 8 below using X.

$$A_1 = 0.056 \times 10^{-4.93 \times X} + 0.0016 \quad \text{Expression 2}$$

$$B_1 = -0.088 \times X^2 + 0.066 \times X + 0.0386 (0.05 \le X \le 0.375) \quad \text{Expression 3}$$

$B_1=0.051 (0.375 \leq X \leq 0.65)$  Expression 4

$C_1=0.714 \times 10^{-5.26 \times X}+29.37$  Expression 5

$A_2=0.0987 \times X^2-0.0918 \times X+0.0644$  Expression 6

$B_2=-0.0651 \times X^2+0.1114 \times X+0.0351$  Expression 7

$C_2=0.7830 \times X^2-1.7424 \times X+32.70$  Expression 8

With the above structure, it is possible to effectively reduce or prevent unwanted waves even when a plurality of IDT electrodes having different electrode finger pitches are provided on the same piezoelectric substrate. This will be described below by comparing the first preferred embodiment with a comparative example.

The comparative example is different from the first preferred embodiment in that Euler angles ($\varphi$, $\theta$, $\psi$) of the piezoelectric substrate do not satisfy the Expression 1. The acoustic wave used in the first preferred embodiment and the comparative example is a Rayleigh wave, and a shear horizontal (SH) wave is an unwanted wave.

The wave length of an IDT electrode of an acoustic wave resonator of the first preferred embodiment and the wave length of an IDT electrode of an acoustic wave resonator of the comparative example were varied to compare return loss characteristics thereof. The average value $\lambda_0$ of the wave length $\lambda_1$ of the first IDT electrode and the wavelength $\lambda_2$ of the second IDT electrode was taken as a reference value, and then the wave length was varied in a range from about $0.90\lambda_0$ to about $1.10\lambda_0$. In the first preferred embodiment, the following conditions were used.

Piezoelectric substrate: Material LiNbO$_3$, Euler angles (0°, 30°, 0°)

Main electrode layer: Material Pt, Film thickness about $0.085\lambda_0$

Conductive auxiliary electrode layer: Material Al, Film thickness about $0.08\lambda_0$ Duty ratio: about 0.60

First dielectric film: Material SiO$_2$, Film thickness about $0.35\lambda_0$

Second dielectric film: Material SiN, Film thickness about $0.01\lambda_0$

In the comparative example, the following conditions were used.

Piezoelectric substrate: Material LiNbO$_3$, Euler angles (0°, 19°, 0°)

Main electrode layer: Material Pt, Film thickness about $0.0425\lambda_0$

Figure 5:
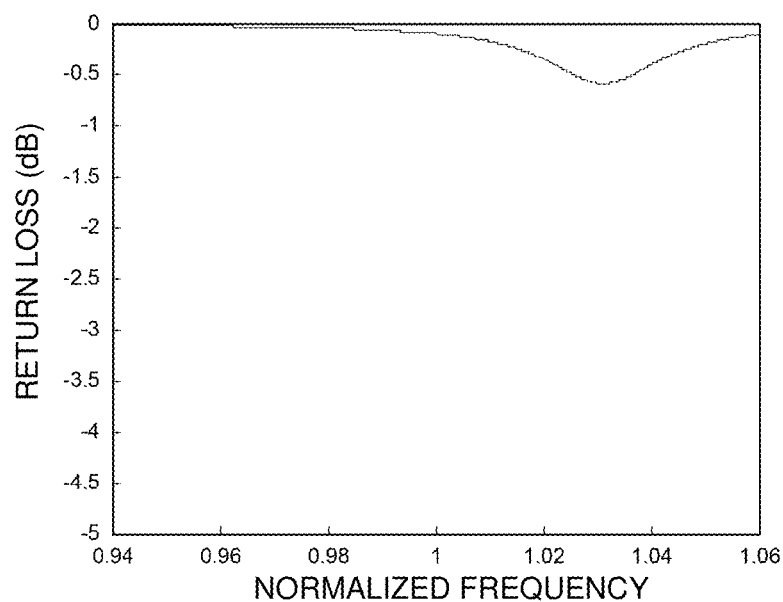
FIG. 5 is a graph showing return loss when a wave length of an IDT electrode of an acoustic wave resonator of a comparative example is set to about $1.00\lambda_0$.
Figure 6:
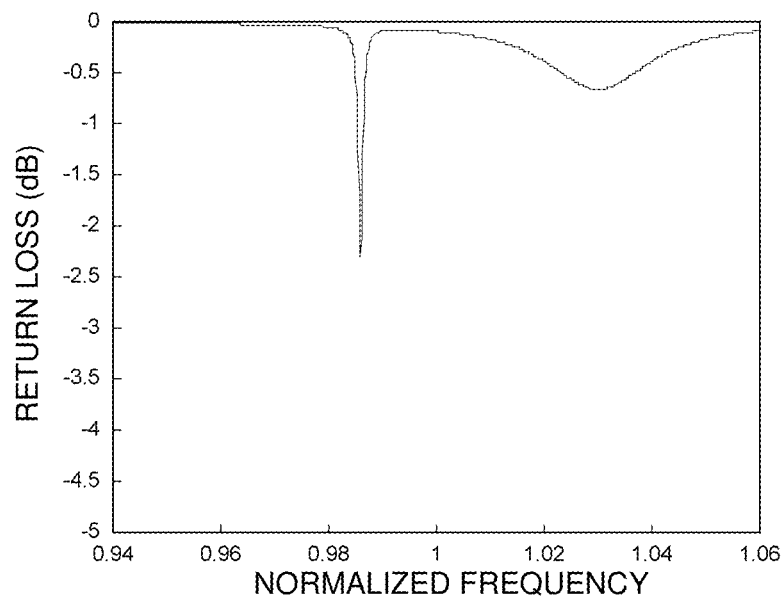
FIG. 6 is a graph showing return loss when the wave length of the IDT electrode of the acoustic wave resonator of the comparative example is set to about $0.90\lambda_0$.
Figure 7:
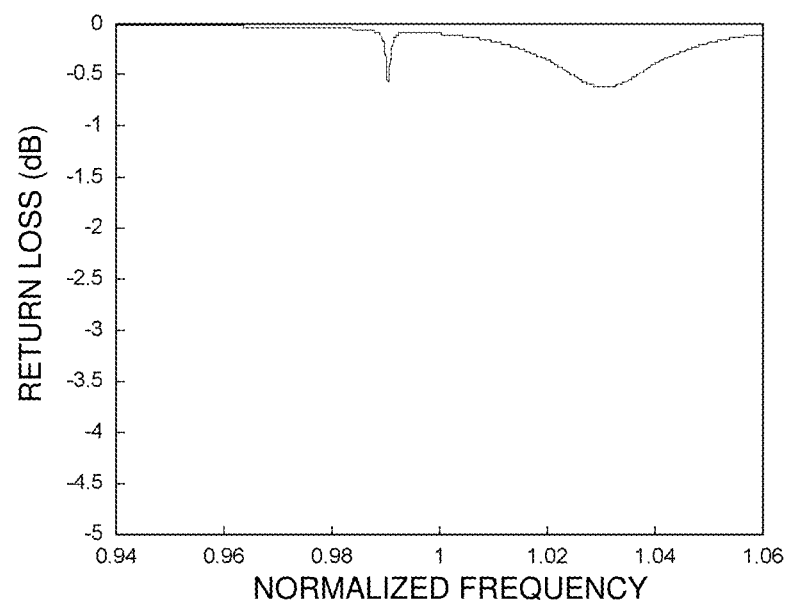
FIG. 7 is a graph showing return loss when the wave length of the IDT electrode of the acoustic wave resonator of the comparative example is set to about $0.95\lambda_0$.
Figure 8:
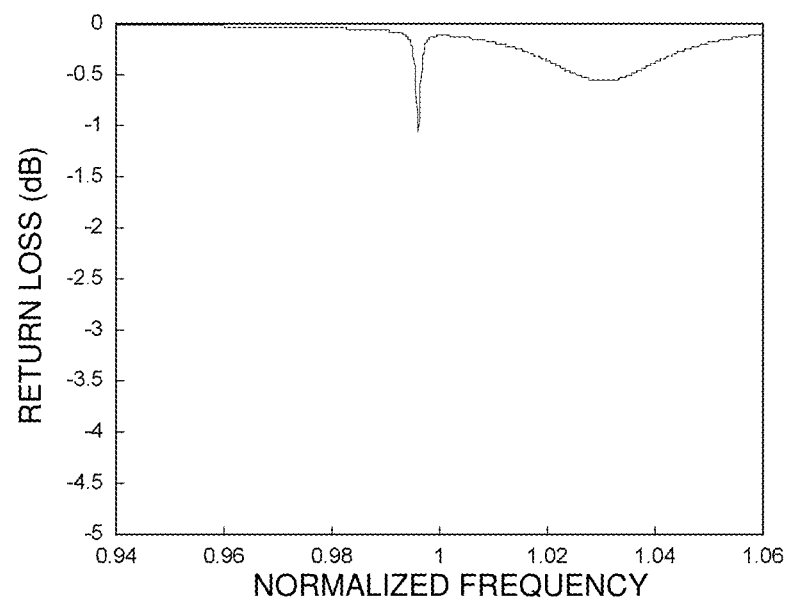
FIG. 8 is a graph showing return loss when the wave length of the IDT electrode of the acoustic wave resonator of the comparative example is set to about $1.05\lambda_0$.
Figure 9:
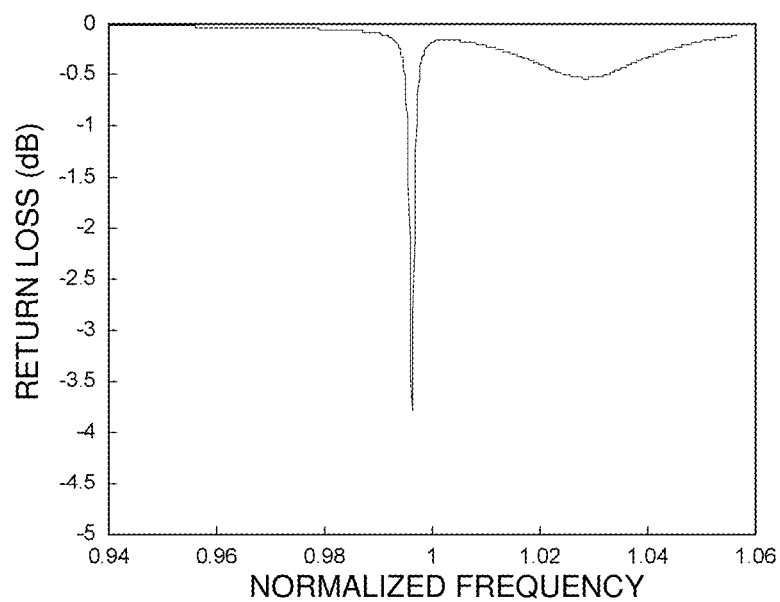
FIG. 9 is a graph showing return loss when the wave length of the IDT electrode of the acoustic wave resonator of the comparative example is set to about $1.10\lambda_0$.

Conductive auxiliary electrode layer: Material Al, Film thickness about $0.08\lambda_0$ Duty ratio: about 0.60 First dielectric film: Material SiO$_2$, Film thickness about $0.35\lambda_0$ Second dielectric film: Material SiN, Film thickness about $0.01\lambda_0$ FIG. 5 is a graph showing return loss when the wave length of the IDT electrode of the acoustic wave resonator of the comparative example is set to about $1.00\lambda_0$. FIG. 6 is a graph showing return loss when the wave length of the IDT electrode of the acoustic wave resonator of the comparative example is set to about $0.90\lambda_0$. FIG. 7 is a graph showing return loss when the wave length of the IDT electrode of the acoustic wave resonator of the comparative example is set to about $0.95\lambda_0$. FIG. 8 is a graph showing return loss when the wave length of the IDT electrode of the acoustic wave resonator of the comparative example is set to about $1.05\lambda_0$. FIG. 9 is a graph showing return loss when the wave length of the IDT electrode of the acoustic wave resonator of the comparative example is set to about $1.10\lambda_0$. In these graphs, the horizontal axis represents a normalized frequency normalized with a resonant frequency of each acoustic wave resonator.

As shown in FIG. 5, in the comparative example, when the wave length of the IDT electrode is set to about $1.00\lambda_0$, spurious noise is suppressed. However, as shown in FIGS. 6 to 9, when the wavelength is equal to or smaller than about $0.95\lambda_0$ and also when the wave length is equal to or greater than about $1.05\lambda_0$, it is understood that a large spurious noise is generated due to the unwanted wave.

When X is about 0.10, $\lambda_1$ is about $1.10\lambda_0$ and $\lambda_2$ is about $0.90\lambda_0$, and the return loss characteristics of the first acoustic wave resonator correspond to FIG. 9 and the return loss characteristics of the second acoustic wave resonator correspond to FIG. 6. At this time, in a case where any value in the range from about $0.90\lambda_0$ to about $1.10\lambda_0$ is the wave length of the IDT electrode, it is preferable to reduce or prevent spurious noise caused by the unwanted wave. However, as shown in FIGS. 5 to 9, when the wave length of the IDT electrode is about $1.00\lambda_0$, no spurious noise is generated, but in the cases where the wave length is about $0.90\lambda_0$, about $0.95\lambda_0$, about $1.05\lambda_0$, and about $1.10\lambda_0$, a large spurious noise is generated. On the other hand, at this time, since $A_1$ is about 0.0196, $B_1$ is about 0.0311, $C_1$ is about 29.58, $A_2$ is about 0.0562, $B_2$ is about 0.0456 and $C_2$ is about 32.53, a relationship of $T \times r < B_2$ is established, such that the condition of $B_2 < T \times r \leq 0.10\lambda_0$ described above is not satisfied. Therefore, in the case of the comparative example, a large spurious noise is generated in some cases within the range of the desired wave length of the IDT electrode, and when the electrode finger pitches of the IDT electrodes are different and the wave lengths are different on the same piezoelectric substrate, it is difficult to reduce or prevent the unwanted wave.

Figure 10:
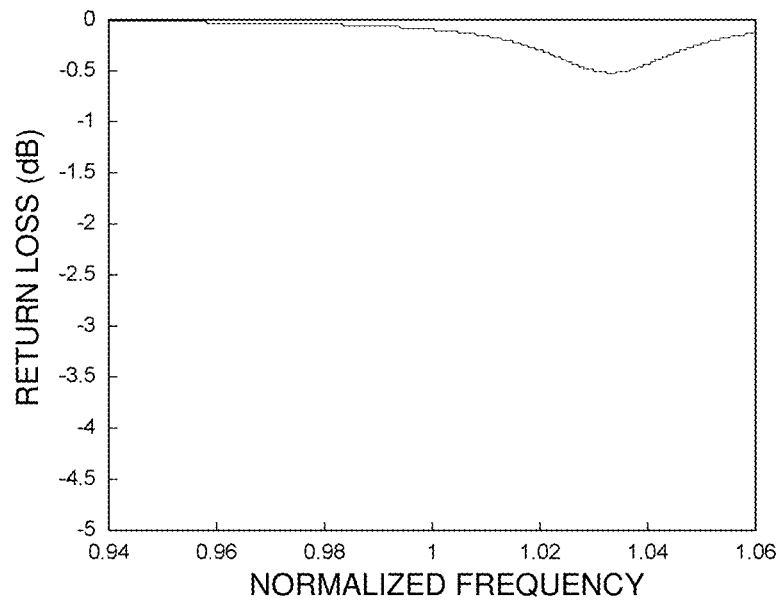
FIG. 10 is a graph showing return loss when a wave length of an IDT electrode of an acoustic wave resonator of the first preferred embodiment of the present invention is set to about $1.00\lambda_0$.
Figure 11:
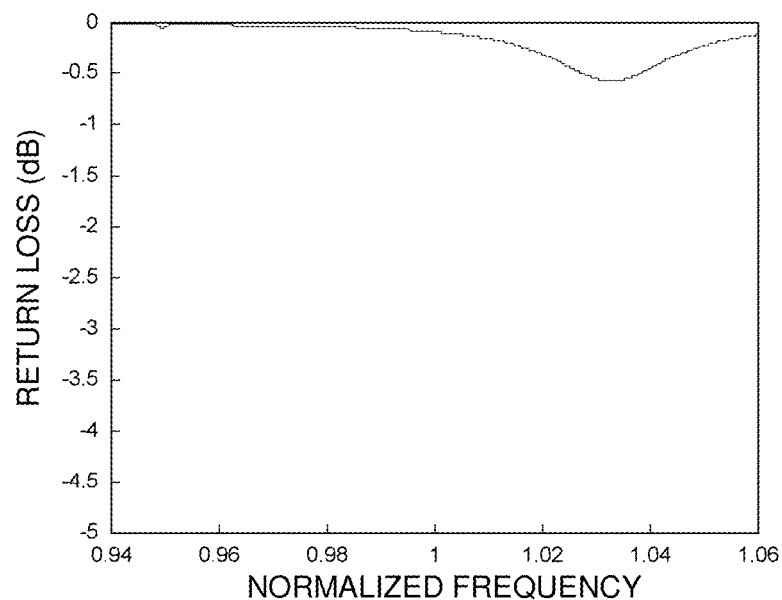
FIG. 11 is a graph showing return loss when the wave length of the IDT electrode of the acoustic wave resonator of the first preferred embodiment of the present invention is set to about $0.90\lambda_0$.
Figure 12:
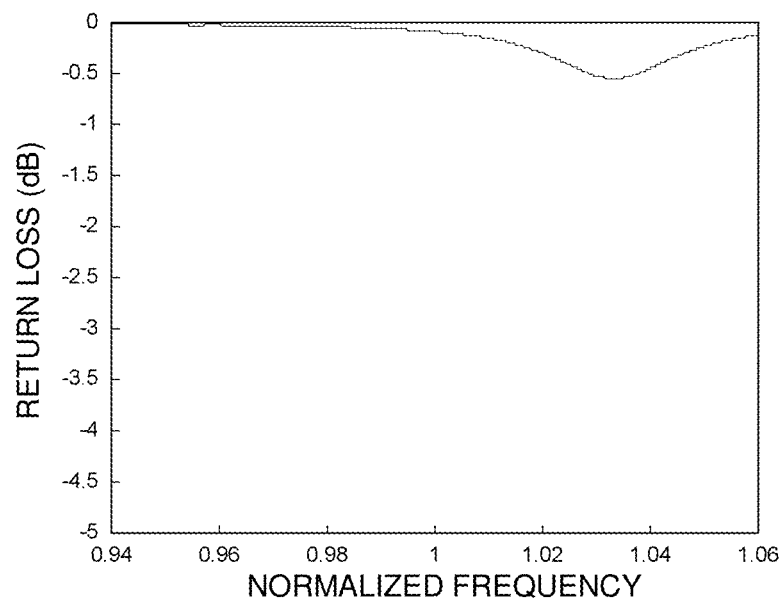
FIG. 12 is a graph showing return loss when the wave length of the IDT electrode of the acoustic wave resonator of the first preferred embodiment of the present invention is set to about $0.95\lambda_0$.
Figure 13:
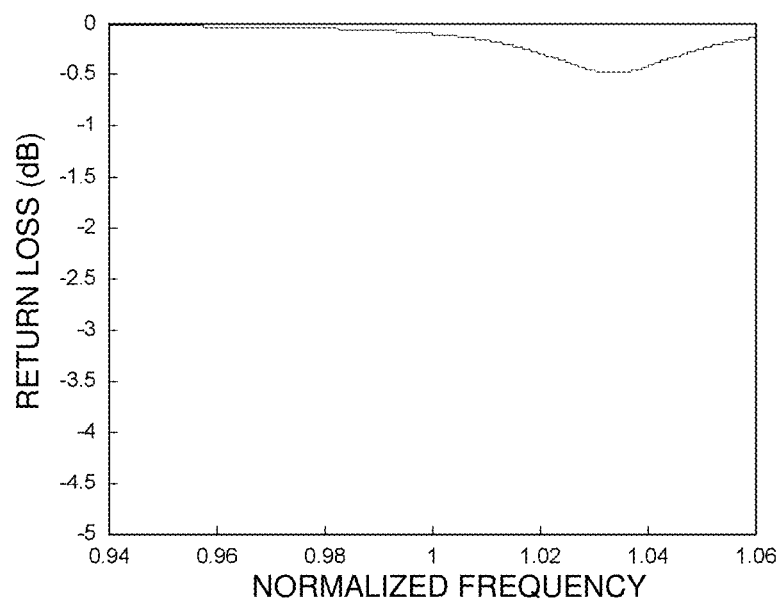
FIG. 13 is a graph showing return loss when the wave length of the IDT electrode of the acoustic wave resonator of the first preferred embodiment of the present invention is set to about $1.05\lambda_0$.
Figure 14:
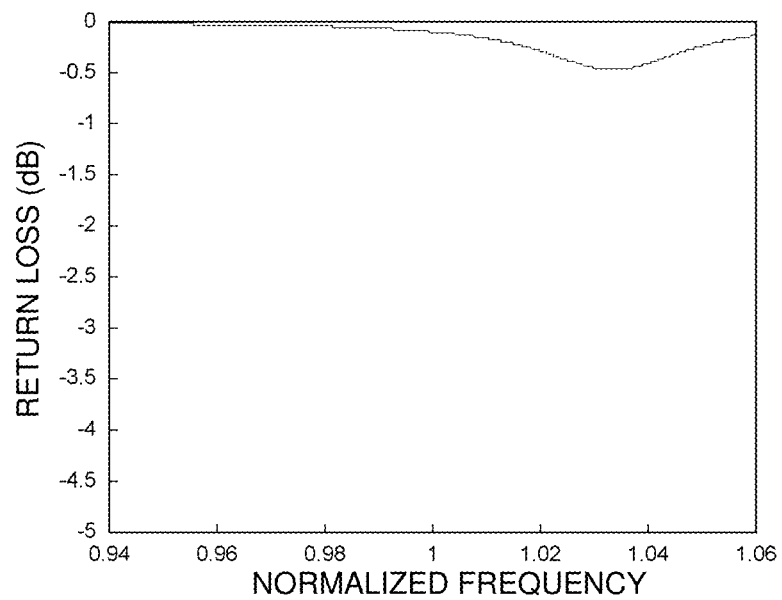
FIG. 14 is a graph showing return loss when the wave length of the IDT electrode of the acoustic wave resonator of the first preferred embodiment of the present invention is set to about $1.10\lambda_0$.

FIG. 10 is a graph showing return loss when the wave length of the IDT electrode of the acoustic wave resonator of the first preferred embodiment is set to about $1.00\lambda_0$. FIG. 11 is a graph showing return loss when the wave length of the IDT electrode of the acoustic wave resonator of the first preferred embodiment is set to about $0.90\lambda_0$. FIG. 12 is a graph showing return loss when the wave length of the IDT electrode of the acoustic wave resonator of the first preferred embodiment is set to about $0.95\lambda_0$. FIG. 13 is a graph showing return loss when the wave length of the IDT electrode of the acoustic wave resonator of the first preferred embodiment is set to about $1.05\lambda_0$. FIG. 14 is a graph showing return loss when the wave length of the IDT electrode of the acoustic wave resonator of the first preferred embodiment is set to about $1.10\lambda_0$.

As shown in FIGS. 10 to 14, in the first preferred embodiment, even when the wave length of the IDT electrode is varied in a range from about $0.90\lambda_0$ to about $1.10\lambda_0$, it is understood that the unwanted wave is effectively reduced or prevented.

Here, in the same manner as described above, when X is about 0.10, $\lambda_1$ is about $1.10\lambda_0$ and $\lambda_2$ is about $0.90\lambda_0$, and the return loss characteristics of the first acoustic wave resonator correspond to FIG. 14 and the return loss characteristics of the second acoustic wave resonator correspond to FIG. 11. As shown in FIGS. 10 to 14, it is understood that spurious noise due to the unwanted wave is effectively reduced or prevented in a case where any value in the range from about $0.90\lambda_0$ to about $1.10\lambda_0$ is the wave length of the IDT electrode. On the other hand, the values of $A_1$, $B_1$, $C_1$, $A_2$, $B_2$, and $C_2$ at this time are the same or substantially the same as those in the comparative example. In this case, with respect to the film thickness T of the main electrode layer of the IDT electrode in the first preferred embodiment, Expression 1 represents the relationship of about 29.09≤θ≤about 31.27, so that θ in the first preferred embodiment satisfies Expression 1. Therefore, even when the electrode finger pitches of the IDT electrodes are different and the wavelengths are different on the same piezoelectric substrate, it is possible to effectively reduce or prevent the unwanted wave.

Hereinafter, the above Expressions 1 through 8 will be described in detail. For this purpose, while using FIGS. 15 to 20 described below, the reference of a fractional bandwidth of the unwanted wave able to sufficiently reduce or prevent the unwanted wave will be provided first. Next, examples in which the value of X is varied will be provided to indicate that the unwanted wave can be sufficiently reduced or prevented by satisfying the above Expressions 1 through 8.

FIGS. 15 to 19 described below show the results of return loss measurement obtained by varying θ in the acoustic wave resonator under the same conditions as those in the acoustic wave resonator of the first preferred embodiment used in the return loss measurement shown in FIG. 10. The wave length of the IDT electrode was set to about $1.00\lambda_0$, and θ in Euler angles (φ, θ, ψ) was varied in a range from above 28° to about 32°. As described above, in the Euler angles (φ, θ, ψ), φ was set to about 0° and ψ was also set to about 0°.

Figure 15:
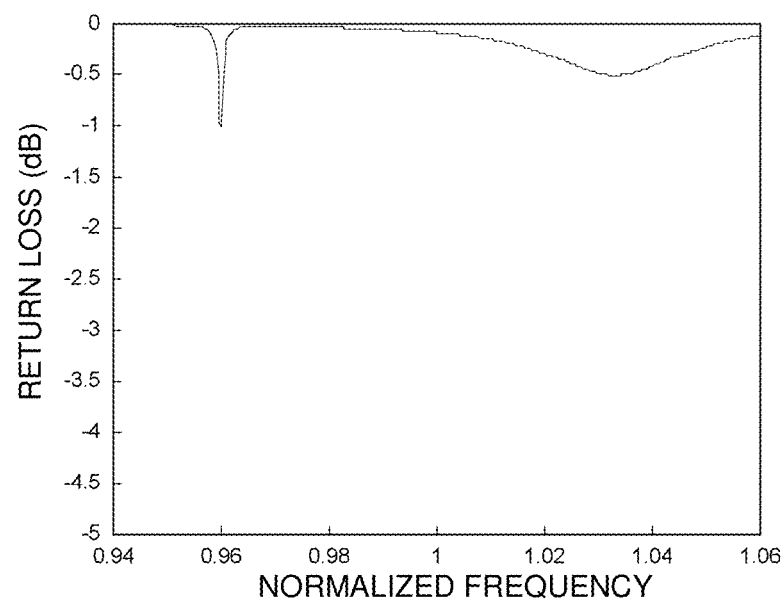
FIG. 15 is a graph showing return loss of an acoustic wave resonator in which a wave length of an IDT electrode is about $1.00\lambda_0$, in the case where $\theta$ in Euler angles $(\varphi, \theta, \psi)$ of a piezoelectric substrate is about 28°.
Figure 16:
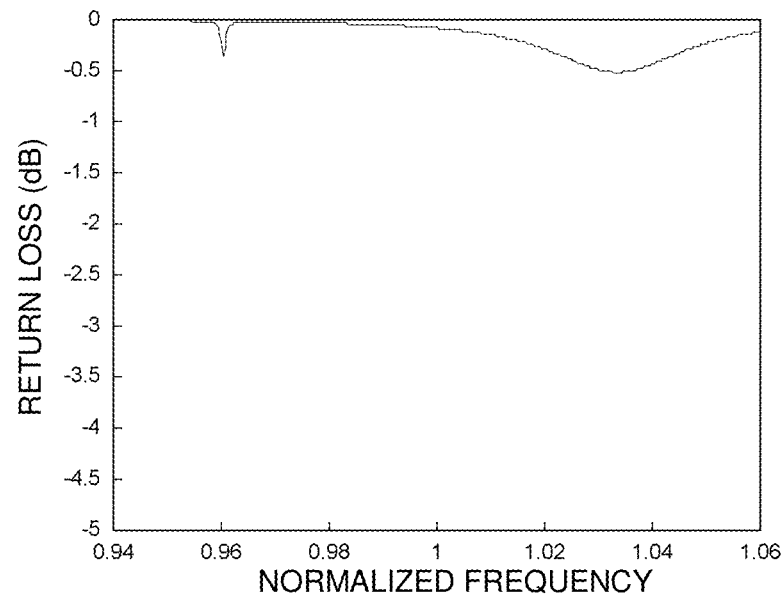
FIG. 16 is a graph showing return loss of the acoustic wave resonator of the present invention in which the wave length of the IDT electrode is about $1.00\lambda_0$, in the case where $\theta$ in the Euler angles $(\varphi, \theta, \psi)$ of the piezoelectric substrate is about 29°.
Figure 17:
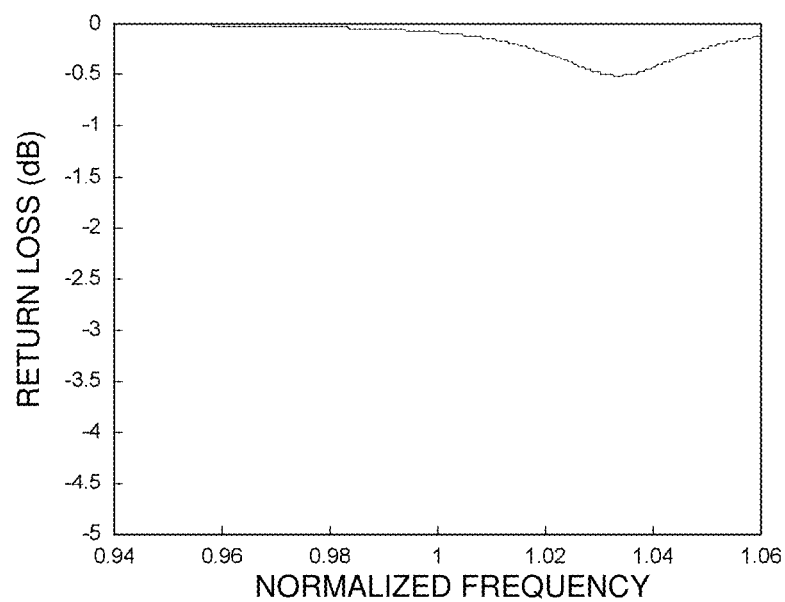
FIG. 17 is a graph showing return loss of the acoustic wave resonator of the present invention in which the wave length of the IDT electrode is about $1.00\lambda_0$, in the case where $\theta$ in the Euler angles $(\varphi, \theta, \psi)$ of the piezoelectric substrate is about 30°.
Figure 18:
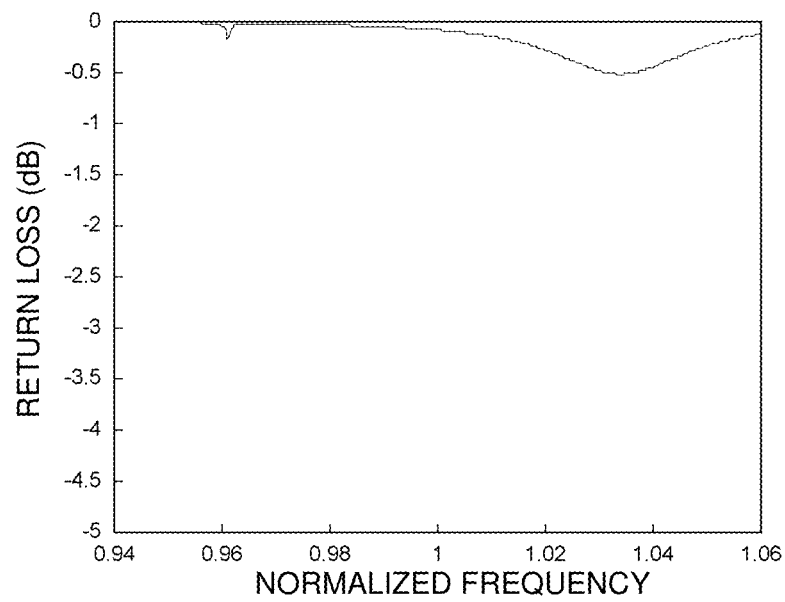
FIG. 18 is a graph showing return loss of the acoustic wave resonator of the present invention in which the wave length of the IDT electrode is about $1.00\lambda_0$, in the case where $\theta$ in the Euler angles $(\varphi, \theta, \psi)$ of the piezoelectric substrate is about 31°.
Figure 19:
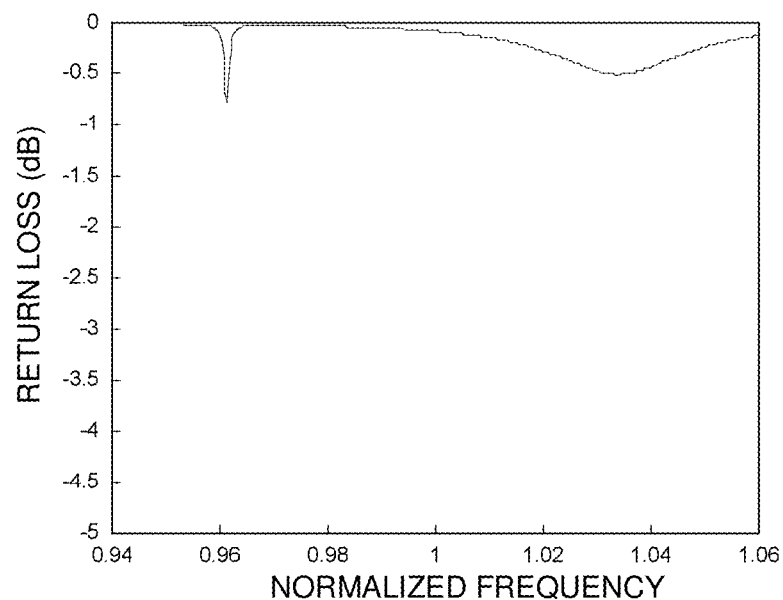
FIG. 19 is a graph showing return loss of the acoustic wave resonator of the present invention in which the wave length of the IDT electrode is about $1.00\lambda_0$, in the case where $\theta$ in the Euler angles $(\varphi, \theta, \psi)$ of the piezoelectric substrate is about 32°.

FIG. 15 is a graph showing return loss of the acoustic wave resonator in which the wave length of the IDT electrode is $1.00\lambda_0$, in the case where θ in Euler angles (φ, θ, ψ) of the piezoelectric substrate is about 28°. FIG. 16 is a graph showing return loss of the acoustic wave resonator in which the wave length of the IDT electrode is about $1.00\lambda_0$, in the case where θ in Euler angles (φ, θ, ψ) of the piezoelectric substrate is about 29°. FIG. 17 is a graph showing return loss of the acoustic wave resonator in which the wave length of the IDT electrode is about $1.00\lambda_0$, in the case where θ in Euler angles (φ, θ, ψ) of the piezoelectric substrate is about 30°. FIG. 18 is a graph showing return loss of the acoustic wave resonator in which the wave length of the IDT electrode is about $1.00\lambda_0$, in the case where θ in Euler angles (φ, θ, ψ) of the piezoelectric substrate is about 31°. FIG. 19 is a graph showing return loss of the acoustic wave resonator in which the wave length of the IDT electrode is about $1.00\lambda_0$, in the case where θ in Euler angles (φ, θ, ψ) of the piezoelectric substrate is about 32°.

As shown in FIG. 15, when θ in the Euler angles (φ, θ, ψ) of the piezoelectric substrate is about 28°, it is understood that spurious noise caused by the unwanted wave is not sufficiently reduced or prevented. In general, in return loss of an acoustic wave resonator, when the absolute value of spurious noise caused by an unwanted wave is larger than about 0.3 dB, there arises a problem that characteristics of the acoustic wave device are significantly deteriorated.

For example, when a ladder acoustic wave filter is defined by using an acoustic wave resonator in which spurious noise is generated, it is known that spurious noise having a size of about one-half to about two-thirds of the size of the spurious noise observed in the return loss of the acoustic wave resonator is generated within the pass band of the acoustic wave filter. Accordingly, when the magnitude of the absolute value of the spurious noise caused by the unwanted wave is about 0.3 dB in the return loss of the acoustic wave resonator, spurious noise having a size of about 0.15 dB to about 0.2 dB is generated within the pass band of the acoustic wave filter.

Figure 30:
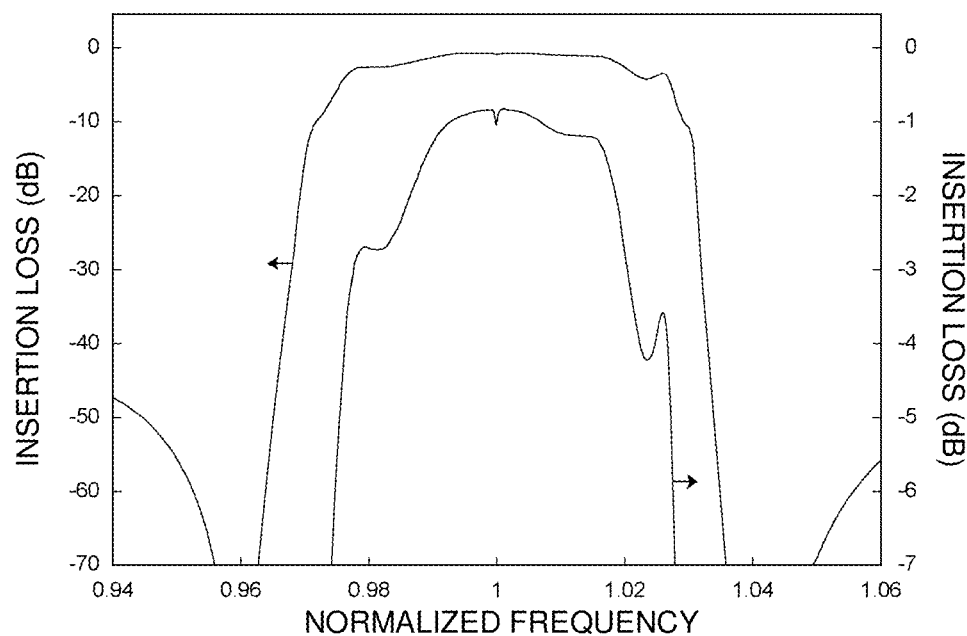
FIG. 30 is a graph showing a transmission characteristic of an acoustic wave filter when spurious noise having a size of about 0.2 dB is generated within a pass band of the acoustic wave filter.

Note that FIG. 30 shows a transmission characteristic of an acoustic wave filter when spurious noise having a size of about 0.2 dB is generated within the pass band of the acoustic wave filter. The horizontal axis in FIG. 30 represents a normalized frequency in which the frequency generating the spurious noise is 1. Generally speaking, the spurious noise of the size shown in FIG. 30 is considered not to raise a problem. Therefore, when the magnitude of the absolute value of spurious noise caused by the unwanted wave is about 0.3 dB in the return loss of the acoustic wave resonator, a situation in which the spurious noise affects operations of the acoustic wave filter, a high frequency front end circuit, and a communication apparatus using the stated acoustic wave resonator is considerably reduced or prevented.

Figure 31:
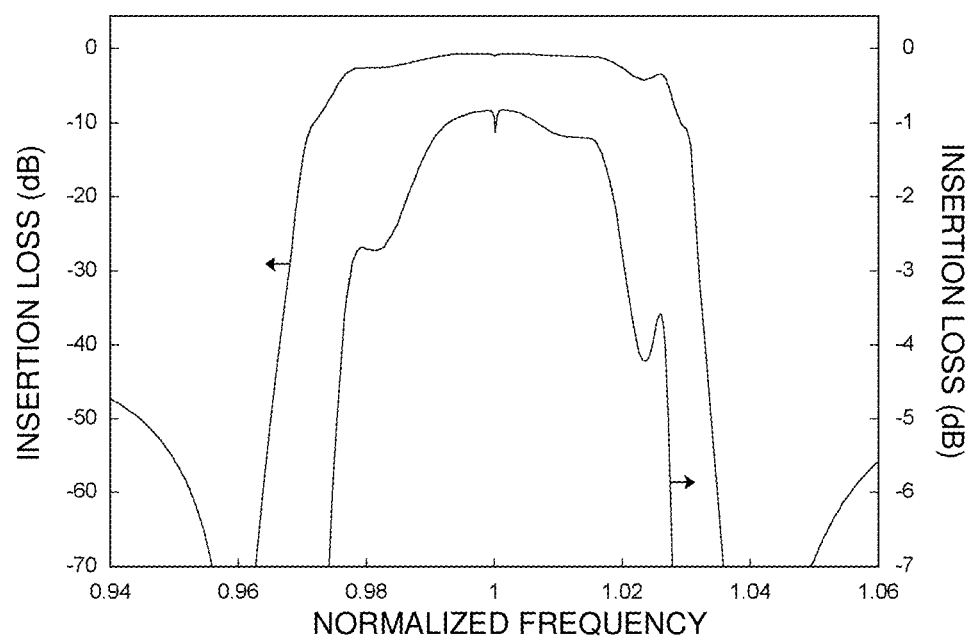
FIG. 31 is a graph showing a transmission characteristic of an acoustic wave filter when spurious noise having a size of about 0.27 dB is generated within a pass band of the acoustic wave filter.

On the other hand, when the magnitude of the absolute value of the spurious noise caused by the unwanted wave is about 0.4 dB in the return loss of the acoustic wave resonator, spurious noise having a size of about 0.2 to about 0.27 dB is generated within the pass band of the acoustic wave filter. FIG. 31 shows a transmission characteristic of the acoustic wave filter when spurious noise having a size of about 0.27 dB is generated within the pass band of the acoustic wave filter. The horizontal axis in FIG. 31 represents a normalized frequency in which the frequency at which the spurious noise is generated is 1. The spurious noise of the size shown in FIG. 31 may raise a problem in the acoustic wave filter. Therefore, when the magnitude of the absolute value of spurious noise caused by the unwanted wave is about 0.4 dB in the return loss of the acoustic wave resonator, it is understood that the spurious noise may affect the operations of the acoustic wave filter, the high frequency front end circuit, and the communication apparatus using the acoustic wave resonator.

As discussed above, when the magnitude of the absolute value of the spurious noise caused by the unwanted wave is greater than about 0.3 dB in the return loss of the acoustic wave resonator, the spurious noise may affect the operations of the acoustic wave filter, high frequency front end circuit, and communication apparatus using the stated acoustic wave resonator. Therefore, by reducing the magnitude of the absolute value of the spurious noise to equal to or smaller than about 0.3 dB in the return loss characteristics of the acoustic wave resonator, it is possible to reduce or prevent the deterioration in filter characteristic of the acoustic wave filter, the high frequency front end circuit, and the communication apparatus using the acoustic wave resonator.

As shown in FIGS. 16 to 18, when the wave length of the IDT electrode is about $1.00\lambda_0$, in the case where θ in the Euler angles (φ, θ, ψ) of the piezoelectric substrate is set to equal to or greater than about 29° and equal to or smaller than about 31°, the magnitude of the absolute value of the spurious noise is able to be set to equal to or smaller than about 0.3 dB. On the other hand, as shown in FIG. 19, in the case where θ is about 32°, the spurious noise caused by the unwanted wave is unable to be sufficiently reduced or prevented.

Figure 20:
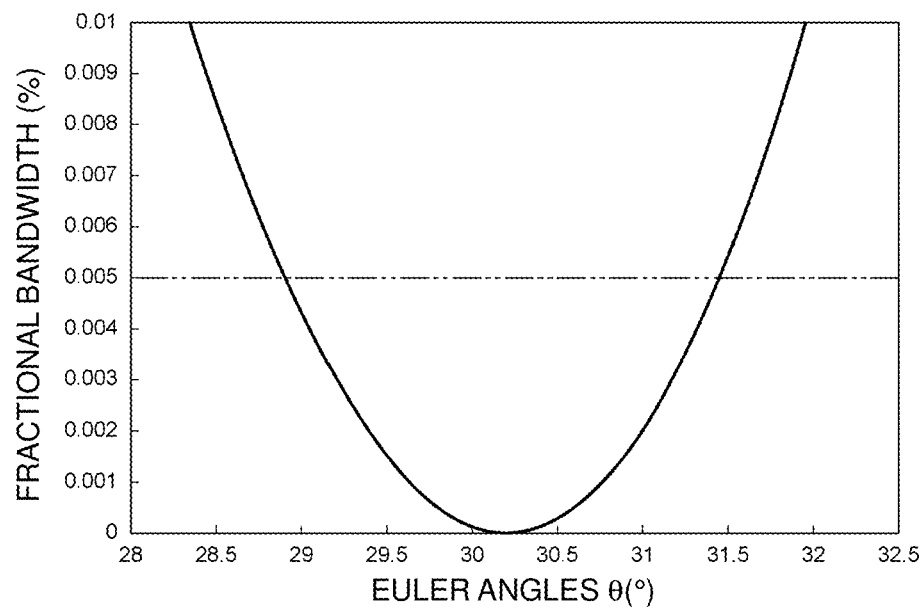
FIG. 20 is a graph showing a relationship between $\theta$ in Euler angles $(\varphi, \theta, \psi)$ of a piezoelectric substrate and a fractional bandwidth of an unwanted wave, in an acoustic wave resonator in which a wave length of an IDT electrode is about $1.00\lambda_0$.

FIG. 20 is a graph showing a relationship between θ in Euler angles (φ, θ, ψ) of a piezoelectric substrate and a fractional bandwidth of an unwanted wave, in an acoustic wave resonator in which a wave length of an IDT electrode is about $1.00\lambda_0$. Note that the unwanted wave in FIG. 20 is an SH wave. Since the size of the fractional bandwidth of the unwanted wave and the size of the spurious noise correspond to each other, the smaller the size of the fractional bandwidth is, the more it is possible to reduce or prevent the spurious noise. The conditions of the acoustic wave resonator used for the measurement in FIG. 20 are the same or substantially the same as those of the acoustic wave resonator of the first preferred embodiment used for the return loss measurement shown in FIG. 10, except that θ is varied. The same applies to the acoustic wave resonators in FIGS. 21, 23, 25, and 27 to be described later.

As shown in FIG. 20, when the wave length of the IDT electrode is about $1.00\lambda_0$, in the case where θ in the Euler angles (φ, θ, ψ) of the piezoelectric substrate is about 30°, the fractional bandwidth of the unwanted wave is nearly 0%. As θ takes a value separate from about 30°, the fractional bandwidth of the unwanted wave becomes larger. In the above, it is indicated that, with reference to FIG. 16, when θ in the Euler angles (φ, θ, ψ) of the piezoelectric substrate is about 29°, the magnitude of the absolute value of the spurious noise caused by the unwanted wave can be set to equal to or smaller than about 0.3 dB so that it is possible to sufficiently reduce or prevent the spurious noise. As shown in FIG. 20, when θ is about 29°, it is understood that the fractional bandwidth of the unwanted wave is equal to or smaller than about 0.005%. Therefore, the spurious noise caused by the unwanted wave can be sufficiently reduced or prevented in the range of θ in which the fractional bandwidth of the unwanted wave is equal to or smaller than about 0.005%.

Under the conditions of the first preferred embodiment shown in FIG. 20, the range of θ in which the fractional bandwidth of the unwanted wave is equal to or smaller than about 0.005% is represented by the relationship of about 28.9°≤θ≤about 31.4°. Therefore, when the wave length of the IDT electrode is about $1.00\lambda_0$ and is a single one, by selecting the above range of θ, the spurious noise caused by the unwanted wave can be sufficiently reduced or prevented.

Next, examples in which the value of X is varied will be described below.

In the acoustic wave device 1 of the first preferred embodiment, among the plurality of IDT electrodes, the wave length $\lambda_1$ of the first IDT electrode is the longest and the wavelength $\lambda_2$ of the second IDT electrode is the shortest. As described above, the wavelength $\lambda_1$ and the wavelength $\lambda_2$ can be represented, using the average value $\lambda_0$ of the wave length $\lambda_1$ and wave length $\lambda_2$, by an expression of $\lambda_1=(1+X)\lambda_0$ and an expression of $\lambda_2=(1-X)\lambda_0$. Hereinafter, in the acoustic wave device 1, a range of θ able to sufficiently reduce or prevent spurious noise caused by the unwanted wave is determined in a case where the wave length takes any value equal to or greater than $\lambda_2$ and equal to or smaller than $\lambda_1$ among the plurality of IDT electrodes.

Figure 21:
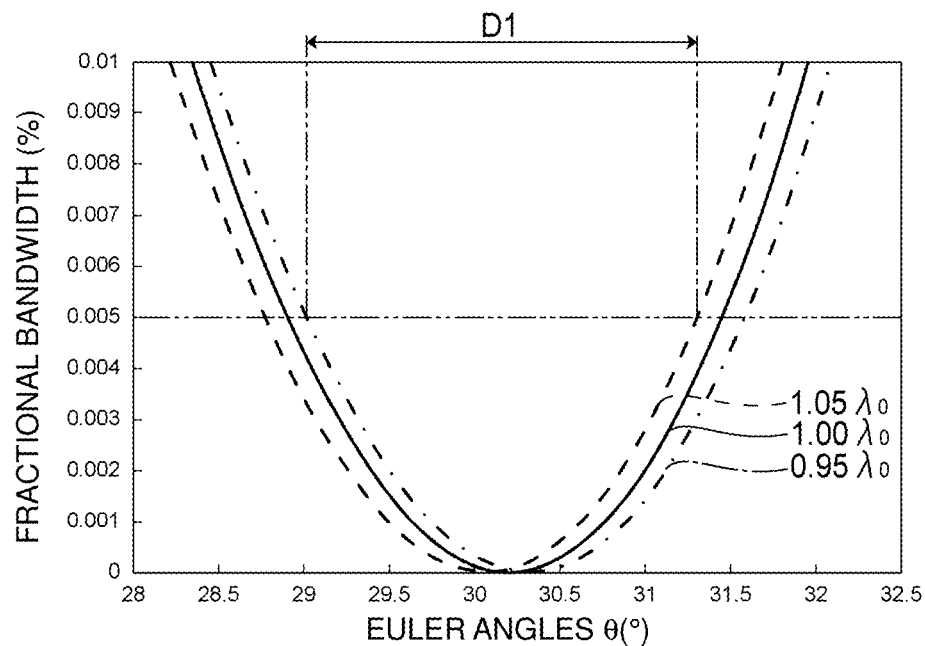
FIG. 21 is a graph showing a relationship among a wave length of an IDT electrode in an acoustic wave resonator, θ in Euler angles (φ, θ, ψ) of a piezoelectric substrate, and a fractional bandwidth of an unwanted wave, in the case where X is about 0.05.

Here, when X is set to about 0.05, the above-mentioned range of θ at which the fractional bandwidth of the unwanted wave becomes equal to or smaller than about 0.005% in the first IDT electrode and the second IDT electrode, is shown in FIG. 21 described below.

FIG. 21 is a graph showing a relationship among the wave length of the IDT electrode in the acoustic wave resonator, θ in the Euler angles (φ, θ, ψ) of the piezoelectric substrate, and the fractional bandwidth of the unwanted wave, in the case where X is about 0.05. A solid line indicates a result of the case where the wave length of the IDT electrode is $\lambda_0$. A broken line indicates a result corresponding to the first IDT electrode having a wave length of about $1.05\lambda_0$. A dot-dash line indicates a result corresponding to the second IDT electrode having a wave length of about $0.95\lambda_0$. The result indicated by the solid line is the same or substantially the same as the result shown in FIG. 20.

As shown in FIG. 21, it is understood that the range of θ in the Euler angles (φ, θ, ψ) of the piezoelectric substrate at which the fractional bandwidth of the unwanted wave is equal to or smaller than about 0.005% differs depending on the wave length of the IDT electrode. When the wave length of the IDT electrode falls within a range from about $0.95\lambda_0$ to about $1.05\lambda_0$, the fractional bandwidth of the unwanted wave can be made equal to or smaller than about 0.005% in the range of about 29.01°≤θ≤about 31.29° indicated by an arrow D1 in FIG. 21. The line representing the relationship between θ and the fractional bandwidth when the wave length of the IDT electrode falls within the range from about $0.95\lambda_0$ to about $1.05\lambda_0$ is present in a region between the broken line and the dot-dash line in FIG. 21. Accordingly, by selecting θ in the range indicated by the arrow D1, the unwanted wave can be sufficiently reduced or prevented in a case where the wave length of the IDT electrode takes any value in the range from about $0.95\lambda_0$ to about $1.05\lambda_0$.

When the film thickness of the main electrode layer of the IDT electrode is different, the relationship between θ in the Euler angles (φ, θ, ψ) and the fractional bandwidth of the unwanted wave is changed. The same or substantially the same evaluation as that in FIG. 21 was performed while varying the thickness of the main electrode layer to obtain a relationship between the film thickness of the main electrode layer and upper and lower limit values of θ at which the fractional bandwidth of the unwanted wave was equal to or smaller than about 0.005%. The results thereof are shown in Table 1 below and FIG. 22.

TABLE 1

| Pt film thickness (λ) | Lower limit value of θ (°) | Upper limit value of θ (°) |
| --- | --- | --- |
| 0.050 | 25.64 | 25.98 |
| 0.055 | 27.29 | 28.41 |
| 0.060 | 27.93 | 29.54 |
| 0.065 | 28.32 | 30.20 |
| 0.070 | 28.60 | 30.63 |
| 0.075 | 28.78 | 30.92 |
| 0.080 | 28.92 | 31.13 |
| 0.085 | 29.01 | 31.29 |
| 0.090 | 29.09 | 31.42 |
| 0.095 | 29.15 | 31.52 |
| 0.100 | 29.19 | 31.60 |
| 0.105 | 29.22 | 31.67 |
| 0.110 | 29.24 | 31.73 |
| 0.115 | 29.25 | 31.78 |
| 0.120 | 29.27 | 31.82 |

Figure 22:
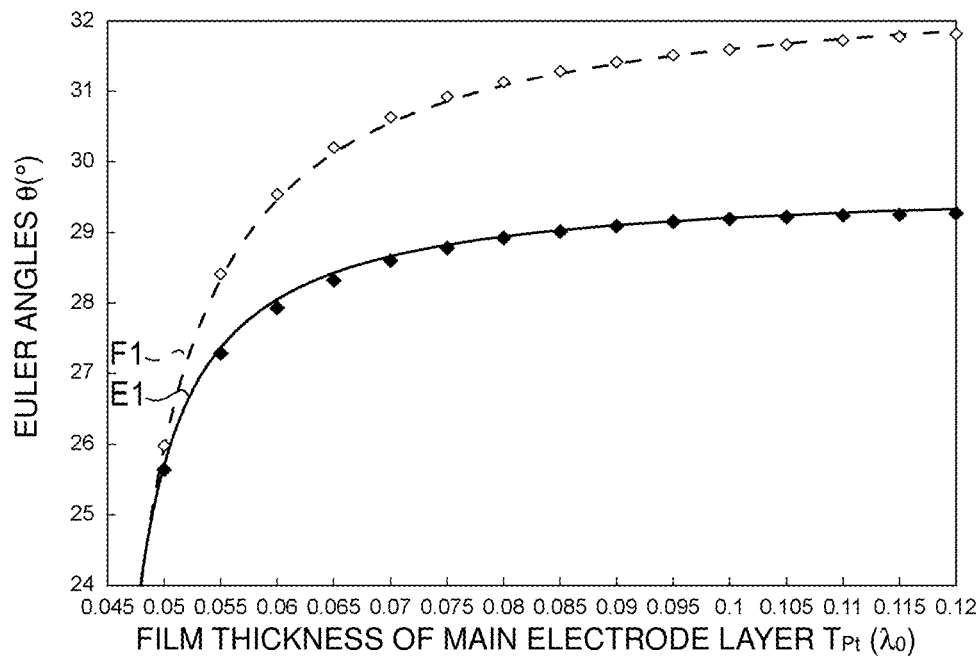
FIG. 22 is a graph showing a relationship between a film thickness of a main electrode layer and upper and lower limit values of θ in Euler angles (φ, θ, ψ) of a piezoelectric substrate at which a fractional bandwidth of an unwanted wave in an acoustic wave resonator is equal to or smaller than about 0.005%, in the case where X is about 0.05.

FIG. 22 is a graph showing a relationship between the film thickness of the main electrode layer and the upper and lower limit values of θ in the Euler angles (φ, θ, ψ) of the piezoelectric substrate at which the fractional bandwidth of the unwanted wave in the acoustic wave resonator is equal to or smaller than about 0.005%, in the case where X is about 0.05. A curved line E1 indicated by a solid line in FIG. 22 shows a relationship between the film thickness of the main electrode layer and the lower limit value of θ at which the fractional bandwidth of the unwanted wave is equal to or smaller than about 0.005%. A curved line F1 indicated by a broken line shows a relationship between the film thickness of the main electrode layer and the upper limit value of θ at which the fractional bandwidth of the unwanted wave is equal to or smaller than about 0.005%.

The curved line E1 in FIG. 22 is represented by an equation of $\theta=-0.028/(T_{Pt}-0.043)+29.70$ when the film thickness of the main electrode layer is $T_{Pt}$. The curved line F1 is represented by an equation of $\theta=-0.060/(T_{Pt}-0.041)+$ 32.62. A region surrounded by the curved line E1 and the curved line F1 in FIG. 22 is a region where the unwanted wave can be sufficiently suppressed. This region can be represented by Expression 9 given below.

$$-0.028/(T_{Pt}-0.043)+29.70 \leq \theta \leq -0.060/(T_{Pt}-0.041)+32.62 \quad \text{Expression 9}$$

As described above, the main electrode layer of the IDT electrode in the first preferred embodiment is preferably made of Pt, for example. $T_{Pt}$ in Expression 9 is a value obtained by normalizing, with $\lambda_0$, the film thickness when the main electrode layer is made of Pt. The lower limit value of the film thickness $T_{Pt}$ in the case of X being about 0.05 is a film thickness at the intersection point of the curved line E1 and the curved line F1, and is about $0.049\lambda_0$.

On the other hand, when the film thickness of the main electrode layer becomes too large, the aspect ratio of the IDT electrode becomes excessively large, thus making it difficult to form the IDT electrode. Further, when the aspect ratio of the IDT electrode is large, the aspect ratio of a gap between the IDT electrodes is also large, so that voids or cracks are likely to be generated in the first dielectric film in this portion. Therefore, it is preferable for the film thickness $T_{Pt}$ when the main electrode layer is made of Pt to be equal to or smaller than about $0.12\lambda_0$, and is more preferable to be equal to or smaller than about $0.10\lambda_0$, for example. In this specification, the aspect ratio of the IDT electrode is a ratio of the film thickness of the electrode finger of the IDT electrode to the dimension along a transverse direction of the electrode finger. The aspect ratio of the gap between the IDT electrodes is a ratio of the film thickness of the electrode fingers adjacent to each other across the gap, to the dimension along the transverse direction of the gap.

When a metal other than Pt is used for the main electrode layer, the film thickness of the main electrode layer may be set to a film thickness corresponding to a density ratio of the above metal and Pt. More specifically, when the density of Pt is $\rho_{Pt}$, and the density of the metal used for the main electrode layer is $\rho$, the density ratio is represented by $\rho/\rho_{Pt}$. When the film thickness of the main electrode layer is T, and the density ratio is represented by an equation of $r=\rho/\rho_{Pt}$, the relationship between the film thickness T and the film thickness $T_{Pt}$ in the above Expression 9 is represented by an equation of $T_{Pt}=T/(\rho_{Pt}/\rho)=T\times r$. By substituting this into Expression 9, Expression 10 can be achieved as follows.

$$-0.028/(T\times r-0.043)+29.70 \leq \theta \leq -0.060/(T\times r-0.041)+32.62 \quad \text{Expression 10}$$

It is preferable that T×r in Expression 10 fall within a range of about $0.049\lambda_0 \leq T\times r \leq$ about $0.10\lambda_0$. Expression 10 indicates a range of θ able to effectively suppress the unwanted wave in the case of X being about 0.05. Expression 10 is an expression achieved by assigning respective numerical values to $A_1$, $B_1$, $C_1$, $A_2$, $B_2$, and $C_2$ in Expression 1 described below.

$$-A_1/(T\times r-B_1)+C_1 \leq \theta \leq -A_2/(T\times r-B_2)+C_2 \quad \text{Expression 1}$$

Also in a case where X takes a value other than about 0.05, it is possible to indicate the range of θ able to effectively reduce or prevent the unwanted wave by an expression achieved by assigning respective numerical values to $A_1$, $B_1$, $C_1$, $A_2$, $B_2$, and $C_2$ in Expression 1. Hereinafter, examples in which X takes values other than about 0.05 will be given to indicate that it is possible to suppress the unwanted wave by satisfying the above expressions 1 through 8 even when X is varied.

Figure 23:
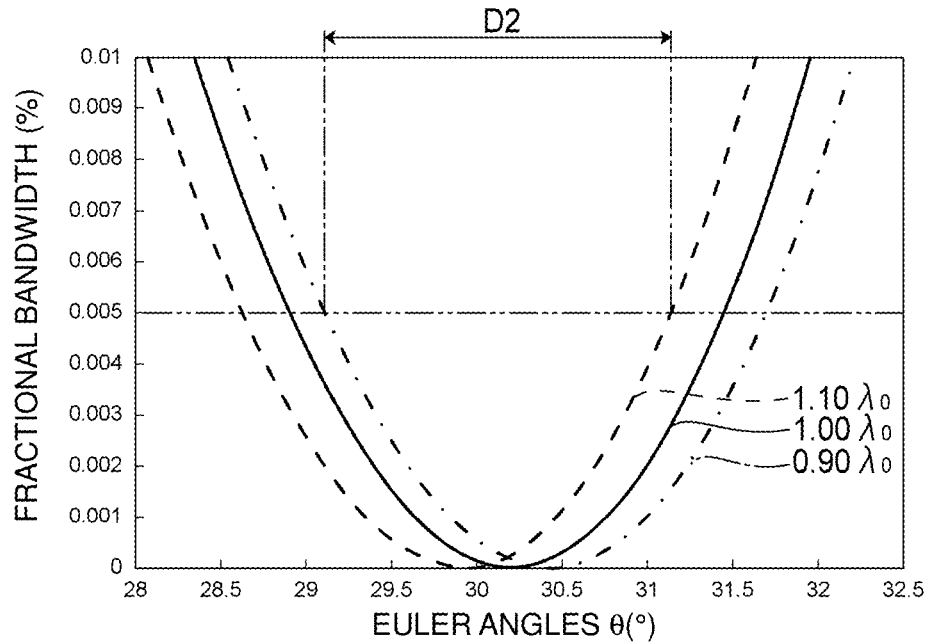
FIG. 23 is a graph showing a relationship among a wave length of an IDT electrode in an acoustic wave resonator, θ in Euler angles (φ, θ, ψ) of a piezoelectric substrate, and a fractional bandwidth of an unwanted wave, in the case where X is about 0.10.

FIG. 23 is a graph showing a relationship among the wave length of the IDT electrode in the acoustic wave resonator, θ in Euler angles (φ, θ, ψ) of the piezoelectric substrate, and the fractional bandwidth of the unwanted wave, in the case where X is about 0.10. A solid line indicates a result of the case where the wave length of the IDT electrode is $\lambda_0$. A broken line indicates a result of the case where the wave length is about $1.10\lambda_0$. A dot-dash line indicates a result of the case where the wave length is about $0.90\lambda_0$.

As shown in FIG. 23, when the wave length of the IDT electrode falls within a range from equal to or greater than about $0.90\lambda_0$ to equal to or smaller than about $1.10\lambda_0$, the fractional bandwidth of the unwanted wave can be made equal to or smaller than about 0.005% in the range of about $29.11° \leq \theta \leq$ about $31.13°$ indicated by an arrow D2. The line representing the relationship between θ and the fractional bandwidth when the wave length of the IDT electrode falls within the range from about $0.90\lambda_0$ to about $1.10\lambda_0$ is present in a region between the broken line and the dot-dash line in FIG. 23. Accordingly, the unwanted wave can be sufficiently reduced or prevented by selecting θ in the range indicated by the arrow D2 in a case where the wave length of the IDT electrode takes any value in the range from about $0.90\lambda_0$ to about $1.10\lambda_0$.

In addition, the same evaluation as that in FIG. 23 was performed while varying the thickness of the main electrode layer to obtain a relationship between the film thickness of the main electrode layer and upper and lower limit values of θ in the Euler angles (φ, θ, ψ) at which the fractional bandwidth of the unwanted wave was equal to or smaller than about 0.005%. The results thereof are shown in Table 2 below and FIG. 24.

TABLE 2

| Pt film thickness (λ) | Lower limit value of θ (°) | Upper limit value of θ (°) |
|---|---|---|
| 0.060 | 28.30 | 28.80 |
| 0.065 | 28.59 | 29.72 |
| 0.070 | 28.79 | 30.28 |
| 0.075 | 28.93 | 30.66 |
| 0.080 | 29.03 | 30.93 |
| 0.085 | 29.11 | 31.13 |
| 0.090 | 29.16 | 31.28 |
| 0.095 | 29.21 | 31.40 |
| 0.100 | 29.23 | 31.51 |
| 0.105 | 29.25 | 31.58 |
| 0.110 | 29.26 | 31.65 |
| 0.115 | 29.27 | 31.71 |
| 0.120 | 29.28 | 31.76 |

Figure 24:
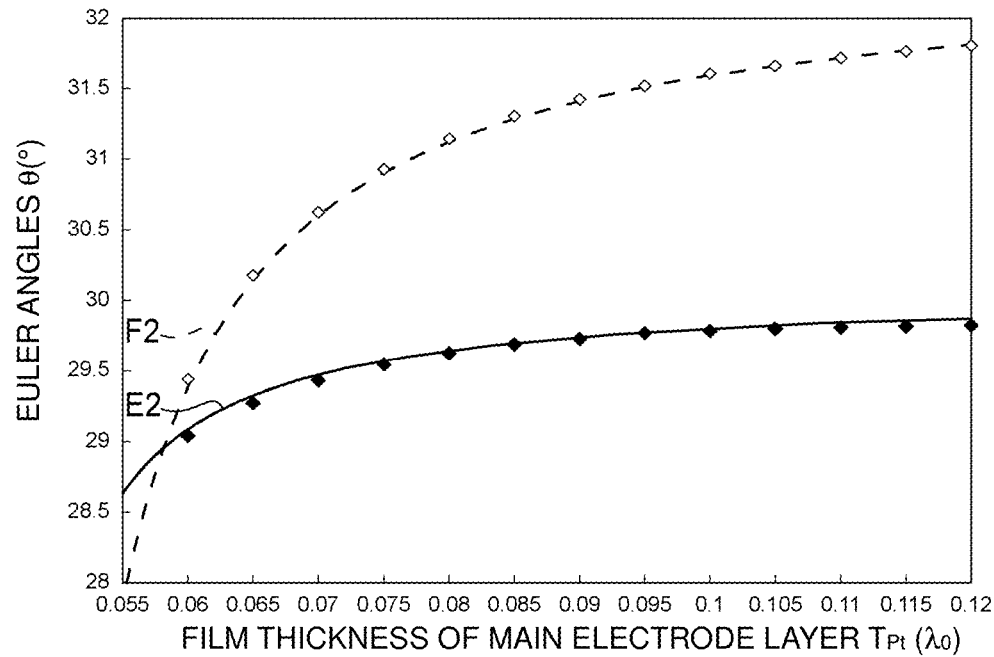
FIG. 24 is a graph showing a relationship between a film thickness of a main electrode layer and upper and lower limit values of θ in Euler angles (φ, θ, ψ) of a piezoelectric substrate at which a fractional bandwidth of an unwanted wave in an acoustic wave resonator is equal to or smaller than about 0.005%, in the case where X is about 0.10.

FIG. 24 is a graph showing a relationship between the film thickness of the main electrode layer and the upper and lower limit values of θ in the Euler angles (φ, θ, ψ) of the piezoelectric substrate at which the fractional bandwidth of the unwanted wave in the acoustic wave resonator is equal to or smaller than 0.005%, in the case where X is about 0.10. A curved line E2 indicated by a solid line in FIG. 24 shows a relationship between the film thickness of the main electrode layer and the lower limit value of θ at which the fractional bandwidth of the unwanted wave is equal to or smaller than about 0.005%. A curved line F2 indicated by a broken line shows a relationship between the film thickness of the main electrode layer and the upper limit value of θ at which the fractional bandwidth of the unwanted wave is equal to or smaller than about 0.005%.

A region surrounded by the curved line E2 and the curved line F2 in FIG. 24 is a region where the unwanted wave can be sufficiently reduced or prevented, in the case where X is about 0.10. By making $T_{Pt}$ to be T×r, this region can be represented by Expression 11 given below. The lower limit value of T×r in the case of X being about 0.10 is seen at the intersection point of the curved line E2 and the curved line F2, and is about $0.058\lambda_0$.

$$-0.020/(T\times r-0.044)+29.61 \leq \theta \leq -0.057/(T\times r-0.045)+32.53 \quad \text{Expression 11}$$

It is preferable that T×r in Expression 11 fall within a range of about $0.058\lambda_0 \leq T\times r \leq$ about $0.10\lambda_0$, for example.

Figure 25:
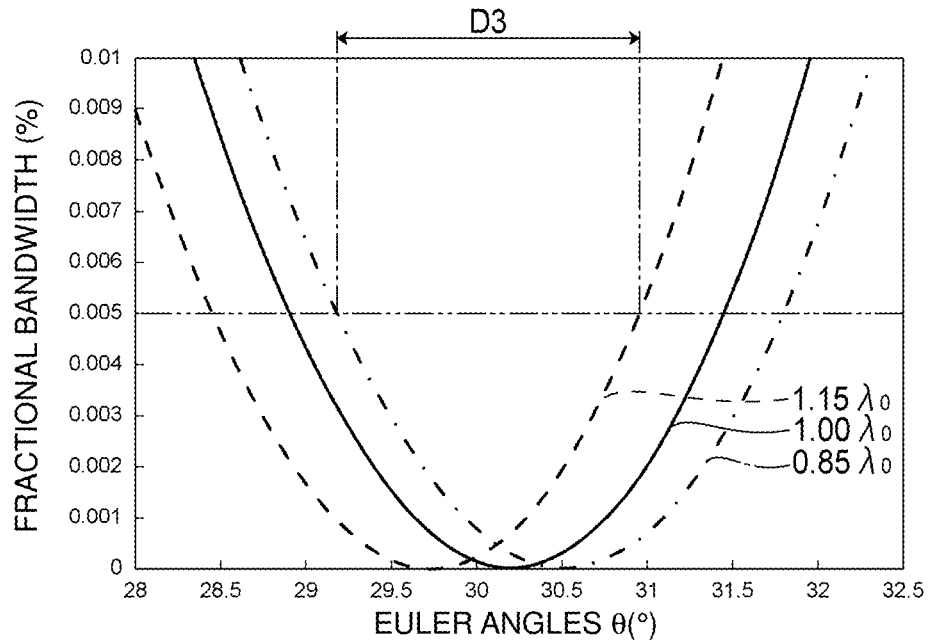
FIG. 25 is a graph showing a relationship among a wave length of an IDT electrode in an acoustic wave resonator, θ in Euler angles (φ, θ, ψ) of a piezoelectric substrate, and a fractional bandwidth of an unwanted wave, in the case where X is about 0.15.

FIG. 25 is a graph showing a relationship among the wave length of the IDT electrode in the acoustic wave resonator, $\theta$ in Euler angles ($\varphi$, $\theta$, $\psi$) of the piezoelectric substrate, and the fractional bandwidth of the unwanted wave, in the case where X is about 0.15. A solid line indicates a result of the case where the wave length of the IDT electrode is $\lambda_0$. A broken line indicates a result of the case where the wave length is about $1.15\lambda_0$. A dot-dash line indicates a result of the case where the wave length is about $0.85\lambda_0$.

As shown in FIG. 25, when the wave length of the IDT electrode falls within a range from about $0.85\lambda_0$ to about $1.15\lambda_0$, the fractional bandwidth of the unwanted wave can be made equal to or smaller than about 0.005% in the range of about $29.18° \leq \theta \leq$ about $30.94°$ indicated by an arrow D3. The line representing the relationship between $\theta$ and the fractional bandwidth when the wave length of the IDT electrode falls within the range from about $0.85\lambda_0$ to about $1.15\lambda_0$ is present in a region between the broken line and the dot-dash line in FIG. 25. Accordingly, the unwanted wave can be sufficiently reduced or prevented by selecting $\theta$ in the range indicated by the arrow D3 in a case where the wave length of the IDT electrode takes any value in the range from about $0.85\lambda_0$ to about $1.15\lambda_0$.

In addition, the same evaluation as that in FIG. 25 was carried out while varying the thickness of the main electrode layer to obtain a relationship between the film thickness of the main electrode layer and upper and lower limit values of $\theta$ in the Euler angles ($\varphi$, $\theta$, $\psi$) at which the fractional bandwidth of the unwanted wave was equal to or smaller than about 0.005%. The results thereof are shown in Table 3 below and FIG. 26.

TABLE 3

| Pt film thickness ($\lambda$) | Lower limit value of $\theta$ (°) | Upper limit value of $\theta$ (°) |
|---|---|---|
| 0.065 | 28.81 | 29.10 |
| 0.070 | 28.95 | 29.86 |
| 0.075 | 29.06 | 30.35 |
| 0.080 | 29.13 | 30.70 |
| 0.085 | 29.18 | 30.94 |
| 0.090 | 29.22 | 31.13 |
| 0.095 | 29.24 | 31.28 |
| 0.100 | 29.26 | 31.39 |
| 0.105 | 29.27 | 31.50 |
| 0.110 | 29.28 | 31.57 |
| 0.115 | 29.28 | 31.63 |
| 0.120 | 29.28 | 31.69 |

Figure 26:
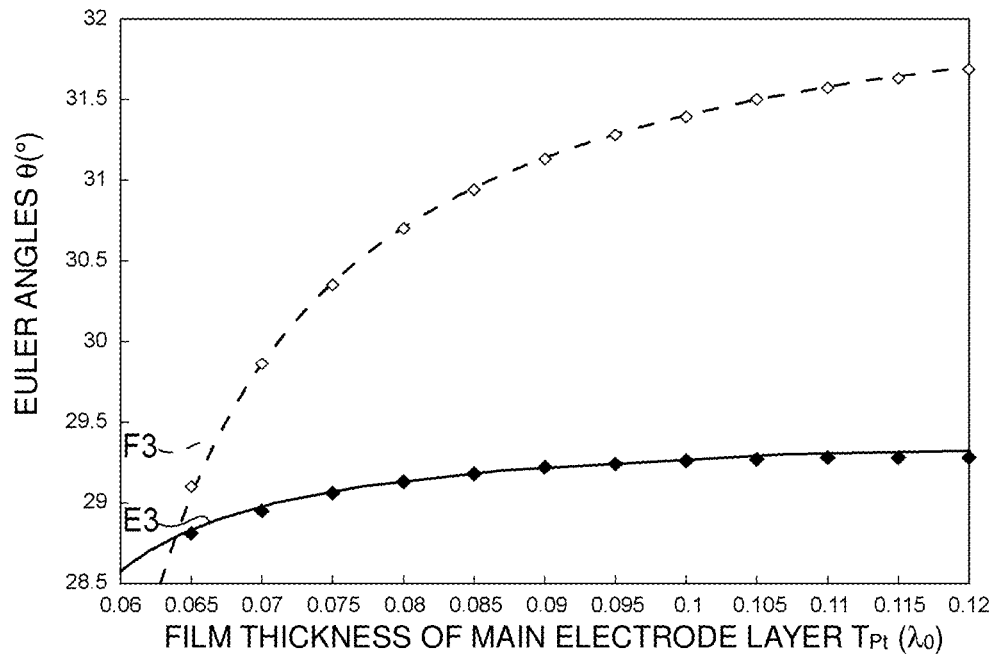
FIG. 26 is a graph showing a relationship between a film thickness of a main electrode layer and upper and lower limit values of θ in Euler angles (φ, θ, ψ) of a piezoelectric substrate at which a fractional bandwidth of an unwanted wave in an acoustic wave resonator is equal to or smaller than about 0.005%, in the case where X is about 0.15.

FIG. 26 is a graph showing a relationship between the film thickness of the main electrode layer and the upper and lower limit values of $\theta$ in the Euler angles ($\varphi$, $\theta$, $\psi$) of the piezoelectric substrate at which the fractional bandwidth of the unwanted wave in the acoustic wave resonator is equal to or smaller than about 0.005%, in the case where X is about 0.15. A curved line E3 indicated by a solid line in FIG. 26 shows a relationship between the film thickness of the main electrode layer and the lower limit value of $\theta$ at which the fractional bandwidth of the unwanted wave is equal to or smaller than about 0.005%. A curved line F3 indicated by a broken line shows a relationship between the film thickness of the main electrode layer and the upper limit value of $\theta$ at which the fractional bandwidth of the unwanted wave is equal to or smaller than about 0.005%.

A region surrounded by the curved line E3 and the curved line F3 in FIG. 26 is a region where the unwanted wave can be sufficiently reduced or prevented, in the case where X is about 0.15. By making $T_{Pt}$ to be T×r, this region can be represented by Expression 12 below. The lower limit value of T×r in the case of X being about 0.15 is seen at the intersection point of the curved line E3 and the curved line F3, and is about $0.064\lambda_0$.

$$-0.012/(T\times r-0.047)+29.50 \leq \theta \leq -0.055/(T\times r-0.049)+32.48 \quad \text{Expression 12}$$

It is preferable that T×r in Expression 12 fall within a range of about $0.064\lambda_0 \leq T\times r \leq$ about $0.10\lambda_0$, for example.

Figure 27:
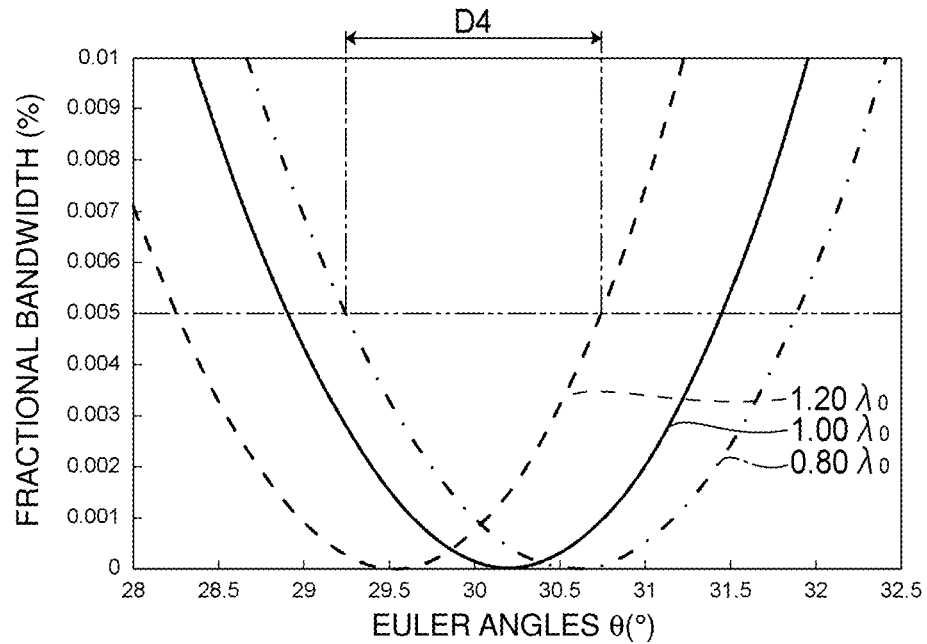
FIG. 27 is a graph showing a relationship among a wave length of an IDT electrode in an acoustic wave resonator, θ in Euler angles (φ, θ, ψ) of a piezoelectric substrate, and a fractional bandwidth of an unwanted wave, in the case where X is about 0.20.

FIG. 27 is a graph showing a relationship among the wave length of the IDT electrode in the acoustic wave resonator, $\theta$ in Euler angles ($\varphi$, $\theta$, $\psi$) of the piezoelectric substrate, and the fractional bandwidth of the unwanted wave, in the case where X is about 0.20. A solid line indicates a result of the case where the wave length of the IDT electrode is $\lambda_0$. A broken line indicates a result of the case where the wave length is about $1.20\lambda_0$. A dot-dash line indicates a result of the case where the wave length is about $0.80\lambda_0$.

As shown in FIG. 27, when the wave length of the IDT electrode falls within a range from about $0.80\lambda_0$ to about $1.20\lambda_0$, the fractional bandwidth of the unwanted wave can be made equal to or smaller than about 0.005% in the range of about $29.24° \leq \theta \leq$ about $30.73°$ indicated by an arrow D4. The line representing the relationship between $\theta$ and the fractional bandwidth when the wave length of the IDT electrode falls within the range from about $0.80\lambda_0$ to about $1.20\lambda_0$ is present in a region between the broken line and the dot-dash line in FIG. 27. Accordingly, the unwanted wave can be sufficiently reduced or prevented by selecting $\theta$ in the range indicated by the arrow D4 in a case where the wave length of the IDT electrode takes any value in the range from about $0.80\lambda_0$ to about $1.20\lambda_0$.

In addition, the same or substantially the same evaluation as that in FIG. 27 was carried out while varying the thickness of the main electrode layer to obtain a relationship between the film thickness of the main electrode layer and upper and lower limit values of $\theta$ in the Euler angles ($\varphi$, $\theta$, $\psi$) at which the fractional bandwidth of the unwanted wave was equal to or smaller than about 0.005%. The results thereof are shown in Table 4 below and FIG. 28.

TABLE 4

| Pt film thickness ($\lambda$) | Lower limit value of $\theta$ (°) | Upper limit value of $\theta$ (°) |
|---|---|---|
| 0.070 | 29.09 | 29.33 |
| 0.075 | 29.16 | 29.99 |
| 0.080 | 29.21 | 30.42 |
| 0.085 | 29.24 | 30.73 |
| 0.090 | 29.26 | 30.96 |
| 0.095 | 29.28 | 31.13 |
| 0.100 | 29.29 | 31.28 |
| 0.105 | 29.29 | 31.39 |
| 0.110 | 29.29 | 31.48 |
| 0.115 | 29.28 | 31.56 |

TABLE 4-continued

| Pt film thickness ($\lambda$) | Lower limit value of $\theta$ (°) | Upper limit value of $\theta$ (°) |
|---|---|---|
| 0.120 | 29.27 | 31.62 |

Figure 28:
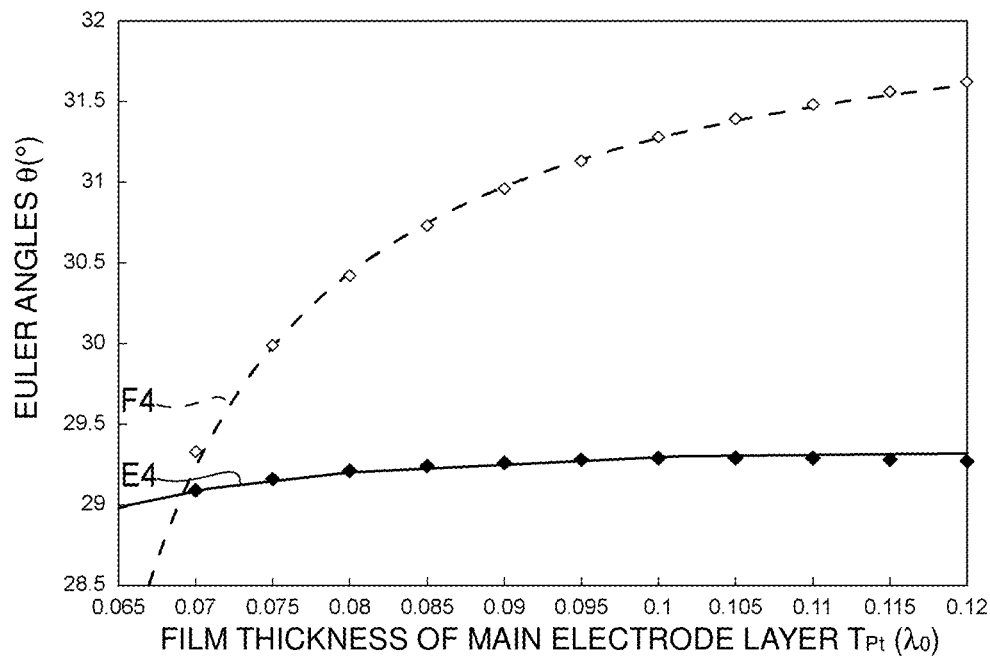
FIG. 28 is a graph showing a relationship between a film thickness of a main electrode layer and upper and lower limit values of θ in Euler angles (φ, θ, ψ) of a piezoelectric substrate at which a fractional bandwidth of an unwanted wave in an acoustic wave resonator is equal to or smaller than about 0.005%, in the case where X is about 0.20.

FIG. 28 is a graph showing a relationship between the film thickness of the main electrode layer and the upper and lower limit values of $\theta$ in the Euler angles $(\varphi, \theta, \psi)$ of the piezoelectric substrate at which the fractional bandwidth of the unwanted wave in the acoustic wave resonator is equal to or smaller than about 0.005%, in the case where X is about 0.20. A curved line E4 indicated by a solid line in FIG. 28 shows a relationship between the film thickness of the main electrode layer and the lower limit value of $\theta$ at which the fractional bandwidth of the unwanted wave is equal to or smaller than about 0.005%. A curved line F4 indicated by a broken line shows a relationship between the film thickness of the main electrode layer and the upper limit value of $\theta$ at which the fractional bandwidth of the unwanted wave is equal to or smaller than about 0.005%.

A region surrounded by the curved line E4 and the curved line F4 in FIG. 28 is a region where the unwanted wave can be sufficiently reduced or prevented, in the case where X is about 0.20. By making $T_{Pt}$ to be T×r, this region can be represented by Expression 13 below. The lower limit value of T×r in the case of X being about 0.20 is seen at the intersection point of the curved line E4 and the curved line F4, and is about $0.069\lambda_0$.

$$-0.008/(T\times r - 0.048) + 29.45 \leq \theta \leq -0.050/(T\times r - 0.054) + 32.36 \qquad \text{Expression 13}$$

It is preferable that T×r in Expression 13 fall within a range of about $0.069\lambda_0 \leq T\times r \leq$ about $0.10\lambda_0$, for example.

In the above, when X was about 0.05, about 0.10, about 0.15, and about 0.20, the above-mentioned range of $\theta$ able to effectively reduce or prevent the unwanted wave was determined. Similarly, also when X was equal to or greater than about 0.25 and equal to or smaller than about 0.65, the range of $\theta$ able to effectively reduce or prevent the unwanted wave was determined. The range of each $\theta$ when X was varied was determined as an expression in which respective numerical values were assigned to $A_1$, $B_1$, $C_1$, $A_2$, $B_2$, and $C_2$ in Expression 1 described below. The values of $A_1$, $B_1$, $C_1$, $A_2$, $B_2$, and $C_2$ are shown in Table 5 below.

TABLE 5

| X | $A_1$ | $B_1$ | $C_1$ | $A_2$ | $B_2$ | $C_2$ |
|---|---|---|---|---|---|---|
| 0.05 | 0.0328 | 0.0417 | 29.76 | 0.0596 | 0.0412 | 32.62 |
| 0.10 | 0.0203 | 0.0444 | 29.59 | 0.0566 | 0.0453 | 32.53 |
| 0.15 | 0.0125 | 0.0461 | 29.49 | 0.0532 | 0.0496 | 32.46 |
| 0.20 | 0.0068 | 0.0485 | 29.42 | 0.0504 | 0.0541 | 32.37 |
| 0.25 | 0.0038 | 0.0498 | 29.39 | 0.0476 | 0.0589 | 32.31 |
| 0.30 | 0.0025 | 0.0507 | 29.39 | 0.0455 | 0.0632 | 32.26 |
| 0.35 | 0.0020 | 0.0510 | 29.38 | 0.0443 | 0.0663 | 32.19 |
| 0.40 | 0.0020 | 0.0510 | 29.38 | 0.0432 | 0.0695 | 32.13 |
| 0.45 | 0.0020 | 0.0510 | 29.38 | 0.0430 | 0.0721 | 32.06 |
| 0.50 | 0.0020 | 0.0510 | 29.38 | 0.0433 | 0.0743 | 32.03 |
| 0.55 | 0.0020 | 0.0510 | 29.38 | 0.0438 | 0.0766 | 31.98 |
| 0.60 | 0.0020 | 0.0510 | 29.38 | 0.0453 | 0.0782 | 31.94 |
| 0.65 | 0.0020 | 0.0510 | 29.38 | 0.0467 | 0.0804 | 31.90 |

Based on these results, $A_1$, $B_1$, $C_1$, $A_2$, $B_2$, and $C_2$ were determined as Expressions 2 through 8 described below using X.

$$-A_1/(T\times r - B_1) + C_1 \leq \theta \leq -A_2/(T\times r - B_2) + C_2 \qquad \text{Expression 1}$$

$A_1$, $B_1$, $C_1$, $A_2$, $B_2$, and $C_2$ in Expression 1 are represented by Expressions 2 through 8 given below using X.

$$A_1 = 0.056 \leq X \leq 10^{-4.93 \times X} + 0.0016 \qquad \text{Expression 2}$$

$$B_1 = -0.088 \times X^2 + 0.066 \times X + 0.0386 (0.05 \leq X \leq 0.375) \qquad \text{Expression 3}$$

$$B_1 = 0.051 (0.375 \leq X \leq 0.65) \qquad \text{Expression 4}$$

$$C_1 = 0.714 \leq X \leq 10^{-5.26 \times X} + 29.37 \qquad \text{Expression 5}$$

$$A_2 = 0.0987 \times X^2 - 0.0918 \times X + 0.0644 \qquad \text{Expression 6}$$

$$B_2 = -0.0651 \times X^2 + 0.1114 \times X + 0.0351 \qquad \text{Expression 7}$$

$$C_2 = 0.7830 \times X^2 - 1.7424 \times X + 32.70 \qquad \text{Expression 8}$$

As discussed above, by satisfying Expressions 1 through 8, it is possible to effectively reduce or prevent the unwanted wave even when the IDT electrodes having different electrode finger pitches are provided on the same piezoelectric substrate.

When T×r equals $B_1$ in the left side of Expression 1, the denominator becomes 0 so that $\theta$ diverges. Similarly, when T×r equals $B_2$ in the right side of Expression 1, the denominator becomes 0 so that $\theta$ diverges. Further, as described above, it is preferable for the film thickness of the main electrode layer of the IDT electrode to be equal to or smaller than about $0.12\lambda_0$, and is more preferable to be equal to or smaller than about $0.10\lambda_0$, for example. Therefore, in the present preferred embodiment, the relationship of $B_1 < T\times r \leq 0.10\lambda_0$, and the relationship of $B_2 < T\times r \leq 0.10\lambda_0$ are determined. When the film thickness of the main electrode layer is equal to or smaller than about $0.10\lambda_0$, in the case where X exceeds about 0.65, the above $\theta$ does not have a range in which it is possible to sufficiently reduce or prevent the unwanted wave. Accordingly, in the first preferred embodiment, X is preferably set to be equal to or smaller than about 0.65, for example.

In the acoustic wave device 1, as illustrated in FIG. 2, the film thickness of the first IDT electrode 4A and the film thickness of the second IDT electrode 4B are equal or substantially equal. The film thickness of a portion of the first dielectric film 8 provided on the first IDT electrode 4A and the film thickness of a portion thereof provided on the second IDT electrode 4B are also equal or substantially equal. Accordingly, the first band pass filter and the second band pass filter in the acoustic wave device 1 can be formed at the same time. As described above, in the first preferred embodiment, unwanted waves can be effectively reduced or prevented without complicating the process.

The acoustic wave device 1 of the first preferred embodiment is a composite filter device used for carrier aggregation or the like. In the following, it will be described that the acoustic wave device 1 is able to effectively reduce or prevent unwanted waves in combinations of various communication bands. Table 6 below shows examples of combinations of communication bands used in carrier aggregation and a center frequency ratio of a reception band of each communication band.

TABLE 6

| Communication band combination | Center frequency ratio |
|---|---|
| Band38-Band7 | 1.023 |
| Band25-Band4 | 1.087 |
| Band4-Band30 | 1.104 |

TABLE 6-continued

| Communication band combination | Center frequency ratio |
|---|---|
| Band7-Band40 | 1.130 |
| Band1-Band3 | 1.161 |
| Band8-Band20 | 1.169 |
| Band3-Band66 | 1.170 |
| Band5-Band13 | 1.174 |
| Band5-Band12 | 1.195 |
| Band25-Band30 | 1.200 |
| Band66-Band41 | 1.203 |
| Band1-Band41 | 1.212 |
| Band66-Band7 | 1.232 |
| Band1-Band7 | 1.241 |
| Band4-Band7 | 1.245 |
| Band3-Band40 | 1.275 |
| Band25-Band41 | 1.321 |
| Band39-Band41 | 1.365 |
| Band1-Band21 | 1.423 |
| Band66-Band21 | 1.433 |
| Band1-Band11 | 1.440 |
| Band3-Band7 | 1.441 |
| Band66-Band11 | 1.450 |

In order to make the pass band of a band pass filter be a desired band, it is necessary to set the wave length determined by the electrode finger pitch of the IDT electrode in the acoustic wave resonator to a wave length corresponding to the desired band. As the center frequency ratio of the combined communication bands is larger, a difference in electrode finger pitch between the IDT electrodes in the acoustic wave resonators becomes larger between one band pass filter and the other band pass filter.

As described before, the first band pass filter 3A illustrated in FIG. 1 is provided with the first acoustic wave resonator including the first IDT electrode having the longest wave length of $\lambda_1$. Accordingly, the wave length of the IDT electrode of the acoustic wave resonator in the acoustic wave device 1 is equal to or smaller than $\lambda_1$. On the other hand, the second band pass filter 3B is provided with the second acoustic wave resonator including the second IDT electrode having the shortest wave length of $\lambda_2$. Accordingly, the wave length of the IDT electrode of the acoustic wave resonator in the acoustic wave device 1 is equal to or greater than $\lambda_2$.

The maximum wave length ratio between the acoustic wave resonator of the first band pass filter 3A and the acoustic wave resonator of the second band pass filter 3B can be represented by an equation of $\lambda_1/\lambda_2 = (1+X)\lambda_0/(1-X)\lambda_0 = (1+X)/(1-X)$. Accordingly, the wave length ratio between the acoustic wave resonator forming the pass band of the first band pass filter 3A and the acoustic wave resonator forming the pass band of the second band pass filter 3B is equal to or smaller than $(1+X)/(1-X)$. When the center frequency ratio between the communication band to which the first band pass filter 3A belongs and the communication band to which the second band pass filter 3B belongs is equal to or smaller than $(1+X)/(1-X)$, the configuration of the first preferred embodiment may be achieved. In this case, unwanted waves can be effectively reduced or prevented.

Here, in the first preferred embodiment, the relationship of about $0.05 \leq X \leq$ about 0.65 is satisfied. For example, when X is about 0.05, a relationship of $\lambda_1/\lambda_2 = (1+X)/(1-X) =$ about 1.105 is established. On the other hand, the center frequency ratio between Band4 and Band30 shown in Table 6 is about 1.104. Therefore, when the communication bands of a center frequency ratio equal to or smaller than the center frequency ration between Band4 and Band30 are combined, it is possible to effectively reduce or prevent unwanted waves.

In addition, for example, when X is about 0.20, $\lambda_1/\lambda_2$ equals about 1.50. Therefore, when the communication bands of a center frequency ratio equal to or smaller than the center frequency ration between Band66 and Band11 shown in Table 6 are combined, it is possible to effectively reduce or prevent unwanted waves. As described thus far, unwanted waves can be effectively reduced or prevented in the combinations of various communication bands.

The acoustic wave device 1 of the first preferred embodiment is preferably a composite filter. The acoustic wave device of the present invention is not limited to the above-described acoustic wave device, and may be, for example, an acoustic wave device including a plurality of acoustic wave filters provided on the same piezoelectric substrate and not connected commonly. A plurality of connected commonly acoustic wave filters and a plurality of not connected commonly acoustic wave filters may be mixed. Alternatively, the acoustic wave device of the present invention may be a ladder filter. As in these cases, even in a case where a plurality of IDT electrodes having different electrode finger pitches is provided on the same piezoelectric substrate, unwanted waves can be effectively reduced or prevented.

The above-described acoustic wave device may be used as a duplexer or the like of a high frequency front end circuit. An example thereof will be described below.

Figure 29:
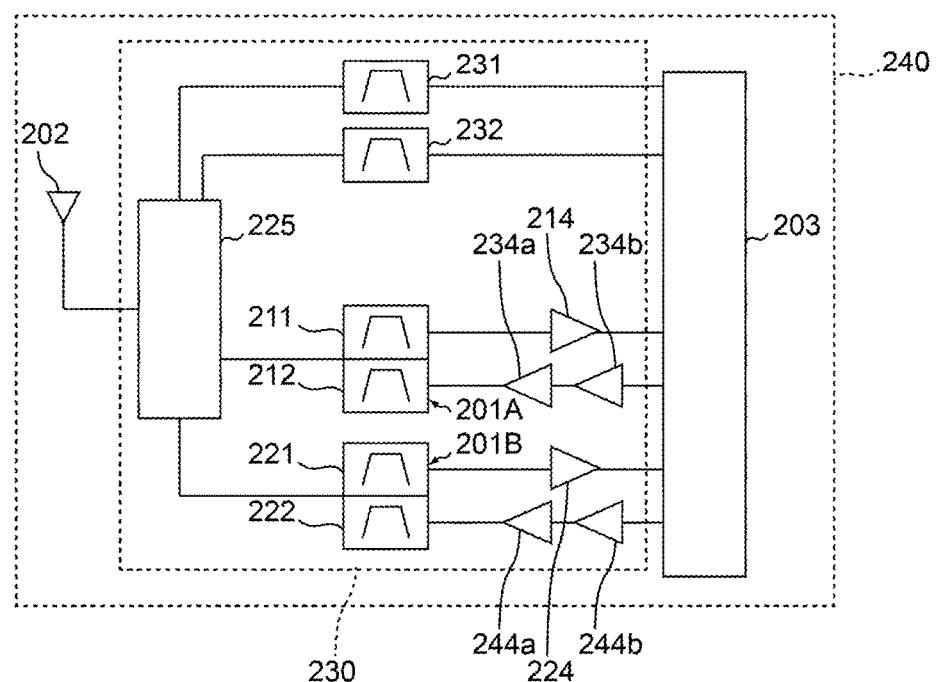
FIG. 29 is a configuration diagram of a communication apparatus including a high frequency front end circuit according to a preferred embodiment of the present invention.

FIG. 29 is a configuration diagram of a communication apparatus and a high frequency front end circuit. In FIG. 29, elements connected to a high frequency front end circuit 230, such as an antenna device 202 and an RF signal processing circuit (RFIC) 203, for example, are also illustrated. The high frequency front end circuit 230 and the RF signal processing circuit 203 define a communication apparatus 240. The communication apparatus 240 may include a power supply, a CPU, a display, and the like, for example.

The high frequency front end circuit 230 includes a switch 225, duplexers 201A and 201B, filters 231 and 232, low-noise amplifier circuits 214 and 224, and power amplifier circuits 234a, 234b, 244a, and 244b. Note that the high frequency front end circuit 230 and the communication apparatus 240 illustrated in FIG. 29 are an example of the high frequency front end circuit and the communication apparatus, and are not limited to this configuration.

The duplexer 201A includes filters 211 and 212. The duplexer 201B includes filters 221 and 222. The duplexers 201A and 201B are connected to the antenna device 202 via the switch 225. The above-described acoustic wave device may be used for the duplexers 201A and 201B, or may be used for the filters 211, 212, 221, and 222.

Further, the above-described acoustic wave device may be applied to, for example, a multiplexer including three or more filters, such as a triplexer in which an antenna terminal for three filters is shared and a hexaplexer in which an antenna terminal for six filters is shared.

That is, the acoustic wave device includes an acoustic wave resonator, a filter, a duplexer, and a multiplexer having three or more filters. The multiplexer is not limited to a configuration including both of a transmission filter and a reception filter, and may be configured to include only a transmission filter or a reception filter.

The switch 225 connects the antenna device 202 to a signal path corresponding to a predetermined band in accordance with a control signal from a control unit (not illustrated), and is preferably defined by, for example, a single pole double throw (SPDT) type switch. Note that the number of signal paths connected to the antenna device 202 is not limited to one, and there may be a plurality of signal paths. In other words, the high frequency front end circuit 230 may support carrier aggregation.

The low-noise amplifier circuit 214 is a reception amplifier circuit configured to amplify a high frequency signal (a high frequency reception signal in this case) coming through the antenna device 202, the switch 225 and the duplexer 201A, and output the amplified high frequency signal to the RF signal processing circuit 203. The low-noise amplifier circuit 224 is a reception amplifier circuit configured to amplify a high frequency signal (a high frequency reception signal in this case) coming through the antenna device 202, the switch 225 and the duplexer 201B, and output the amplified high frequency signal to the RF signal processing circuit 203.

The power amplifier circuits 234a and 234b are transmission amplifier circuits configured to amplify a high frequency signal (a high frequency transmission signals in this case) output from the RF signal processing circuit 203, and output the amplified high frequency signal to the antenna device 202 via the duplexer 201A and the switch 225. The power amplifier circuits 244a and 244b are transmission amplifier circuits configured to amplify a high frequency signal (a high frequency transmission signals in this case) output from the RF signal processing circuit 203, and output the amplified high frequency signal to the antenna device 202 via the duplexer 201B and the switch 225.

The RF signal processing circuit 203 performs signal processing, by down-conversion or the like, on a high frequency reception signal input from the antenna device 202 through a reception signal path, and outputs a reception signal having been generated by the signal processing. The RF signal processing circuit 203 performs signal processing, by up-conversion or the like, on an input transmission signal, and outputs a high frequency transmission signal having been generated by the signal processing to the power amplifier circuits 234a, 234b, 244a, and 244b. The RF signal processing circuit 203 is preferably, for example, an RFIC. The communication apparatus may include a baseband (BB) IC. In this case, the BBIC performs signal processing on the reception signal having been processed by the RFIC. Further, the BBIC performs signal processing on a transmission signal and outputs the signal to the RFIC. The reception signal having been processed by the BBIC, the transmission signal before the signal processing by the BBIC, and the like are, for example, an image signal and a sound signal.

According to the high frequency front end circuit 230 and the communication apparatus 240 configured as described above, unwanted waves can be effectively reduced or prevented.

The high frequency front end circuit 230 may include duplexers according to a modification of the duplexers 201A and 201B in place of the duplexers 201A and 201B.

On the other hand, the filters 231 and 232 in the communication apparatus 240 are connected between the RF signal processing circuit 203 and the switch 225 without passing through the low-noise amplifier circuits 214, 224 and the power amplifier circuits 234a, 234b, 244a, and 244b. The filters 231 and 232 are also connected to the antenna device 202 via the switch 225, similarly to the duplexers 201A and 201B.

Thus far, the acoustic wave devices, the high frequency front end circuits, and the communication apparatuses according to the preferred embodiments of the present invention have been described while referring to the preferred embodiments and the modifications thereof. However, other preferred embodiments achieved by combining arbitrary elements of the above preferred embodiments and modifications, modifications obtained by making variations conceived by those skilled in the art on the preferred embodiments described above without departing from the spirit and scope of the present invention, various equipment incorporating the high frequency front end circuit and the communication apparatus according to the present invention, and the like are also included in the present invention.

Preferred embodiments of the present invention may be widely used in communication equipment such as mobile phones, for example, as an acoustic wave resonator, a filter, a duplexer, a multiplexer applicable to a multi-band system, a front end circuit, and a communication apparatus.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a piezoelectric substrate made of $LiNbO_3$;
   a plurality of interdigital transducer (IDT) electrodes provided on the piezoelectric substrate and including a first IDT electrode and a second IDT electrode; and
   a dielectric film provided on the piezoelectric substrate to cover the plurality of IDT electrodes; wherein
   the first IDT electrode and the second IDT electrode include main electrode layers;
   among the plurality of IDT electrodes, a wave length $\lambda_1$ determined by an electrode finger pitch of the first IDT electrode is the longest and a wave length $\lambda_2$ determined by an electrode finger pitch of the second IDT electrode is the shortest; and
   in Euler angles ($\varphi$, $\theta$, $\psi$) of the piezoelectric substrate, $\varphi$ is 0° ±5° and $\psi$ is 0° ±10°.

2. The acoustic wave device according to claim 1, wherein a plurality of band pass filters belonging to communication bands of different pass bands are provided on the piezoelectric substrate.

3. The acoustic wave device according to claim 2, wherein an antenna terminal to be connected to an antenna is provided on the piezoelectric substrate; and
   the plurality of band pass filters are commonly connected to the antenna terminal to define a composite filter.

4. The acoustic wave device according to claim 2, wherein a composite filter is not defined by the plurality of band pass filters.

5. A high frequency front end circuit comprising:
   acoustic wave device according to claim 1; and
   a power amplifier.

6. A communication apparatus comprising:
   the high frequency front end circuit according to claim 5; and
   an RF signal processing circuit.

7. An acoustic wave device comprising:
   a piezoelectric substrate made of $LiNbO_3$;
   a plurality of interdigital transducer (IDT) electrodes provided on the piezoelectric substrate and including a first IDT electrode and a second IDT electrode; and
   a dielectric film provided on the piezoelectric substrate to cover the plurality of IDT electrodes; wherein
   the first IDT electrode and the second IDT electrode include main electrode layers;
   among the plurality of IDT electrodes, a wave length $\lambda_1$ determined by an electrode finger pitch of the first IDT electrode is the longest and a wave length $\lambda_2$ determined by an electrode finger pitch of the second IDT electrode is the shortest; and in Euler angles (φ, θ, ψ) of the piezoelectric substrate, ψ is 0° ±5° and ψ is 0° ±10°.

8. The acoustic wave device according to claim 7, wherein a plurality of band pass filters belonging to communication bands of different pass bands are provided on the piezoelectric substrate.

9. The acoustic wave device according to claim 8, wherein
an antenna terminal to be connected to an antenna is provided on the piezoelectric substrate; and
the plurality of band pass filters are commonly connected to the antenna terminal to define a composite filter.

10. The acoustic wave device according to claim 8, wherein a composite filter is not defined by the plurality of band pass filters.

11. A high frequency front end circuit comprising:
acoustic wave device according to claim 7; and
a power amplifier.

12. A communication apparatus comprising:
the high frequency front end circuit according to claim 11; and
an RF signal processing circuit.

* * * * *